(12) United States Patent
Kitamori et al.

(10) Patent No.: US 9,924,123 B2
(45) Date of Patent: Mar. 20, 2018

(54) IMAGE SENSOR

(71) Applicant: RENESAS ELECTRONICS CORPORATION, Tokyo (JP)

(72) Inventors: Tatsuya Kitamori, Tokyo (JP); Katsumi Dosaka, Tokyo (JP); Fumihide Murao, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/961,630

(22) Filed: Dec. 7, 2015

(65) Prior Publication Data

US 2016/0227143 A1  Aug. 4, 2016

(30) Foreign Application Priority Data

Jan. 30, 2015 (JP) ................. 2015-016680

(51) Int. Cl.
| | |
|---|---|
| G02B 7/36 | (2006.01) |
| G02B 7/30 | (2006.01) |
| H04N 5/3745 | (2011.01) |
| H04N 5/374 | (2011.01) |
| H04N 5/369 | (2011.01) |
| H01L 27/146 | (2006.01) |

(52) U.S. Cl.
CPC .......... *H04N 5/37457* (2013.01); *G02B 7/30* (2013.01); *G02B 7/365* (2013.01); *H01L 27/14627* (2013.01); *H04N 5/3696* (2013.01); *H04N 5/3742* (2013.01)

(58) Field of Classification Search
CPC .. H04N 5/23212; H04N 5/374; H04N 5/3745; H04N 5/37457; H01L 27/14641; H01L 27/14609; H01L 27/14612; H01L 27/14627; G02B 7/34; G02B 7/346; G02B 7/28–7/40
See application file for complete search history.

(56) References Cited

U.S. PATENT DOCUMENTS

2016/0099268 A1* 4/2016 Minowa ............ H01L 27/14603
250/208.1

FOREIGN PATENT DOCUMENTS

| | | |
|---|---|---|
| EP | 1085751 B2 | 11/2012 |
| JP | 3774597 B2 | 5/2006 |

* cited by examiner

*Primary Examiner* — Paul Berardesca
(74) *Attorney, Agent, or Firm* — McDermott Will & Emery LLP

(57) ABSTRACT

In an image sensor according to related art, charge information cannot be read at the same time from a pair of photoelectric conversion elements placed corresponding to one microlens. According to one embodiment, an image sensor includes a first photoelectric conversion element and a second photoelectric conversion element placed corresponding to one microlens, a first transfer transistor placed corresponding to the first photoelectric conversion element and a second transfer transistor placed corresponding to the second photoelectric conversion element, a read timing signal line that supplies a common read timing signal to the first transfer transistor and the second transfer transistor, a first output line that outputs a signal of the first photoelectric conversion element to the outside, and a second output line that outputs a signal of the second photoelectric conversion element to the outside.

9 Claims, 24 Drawing Sheets

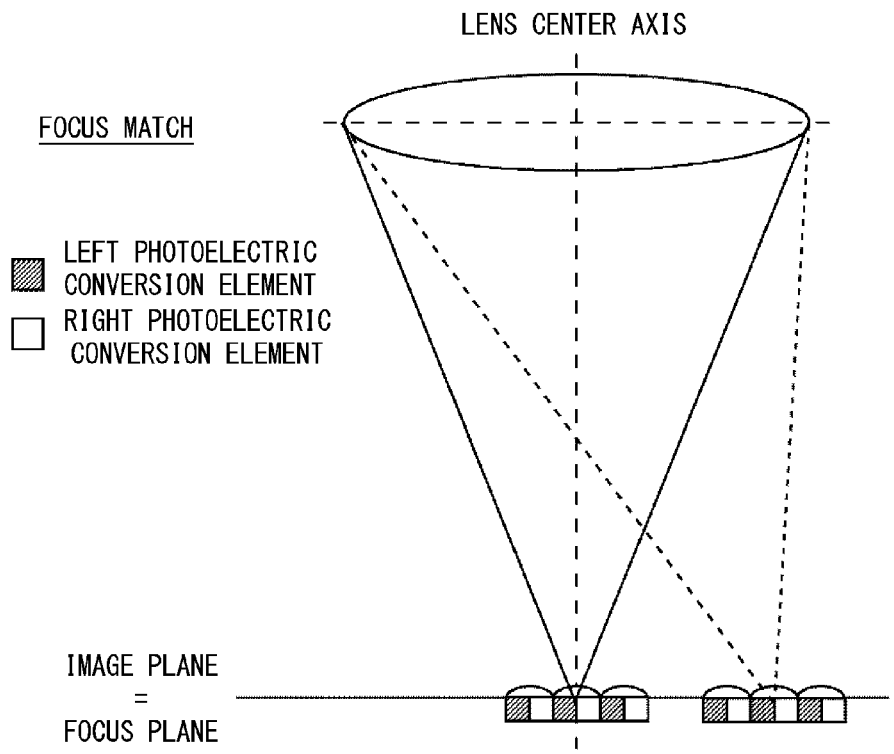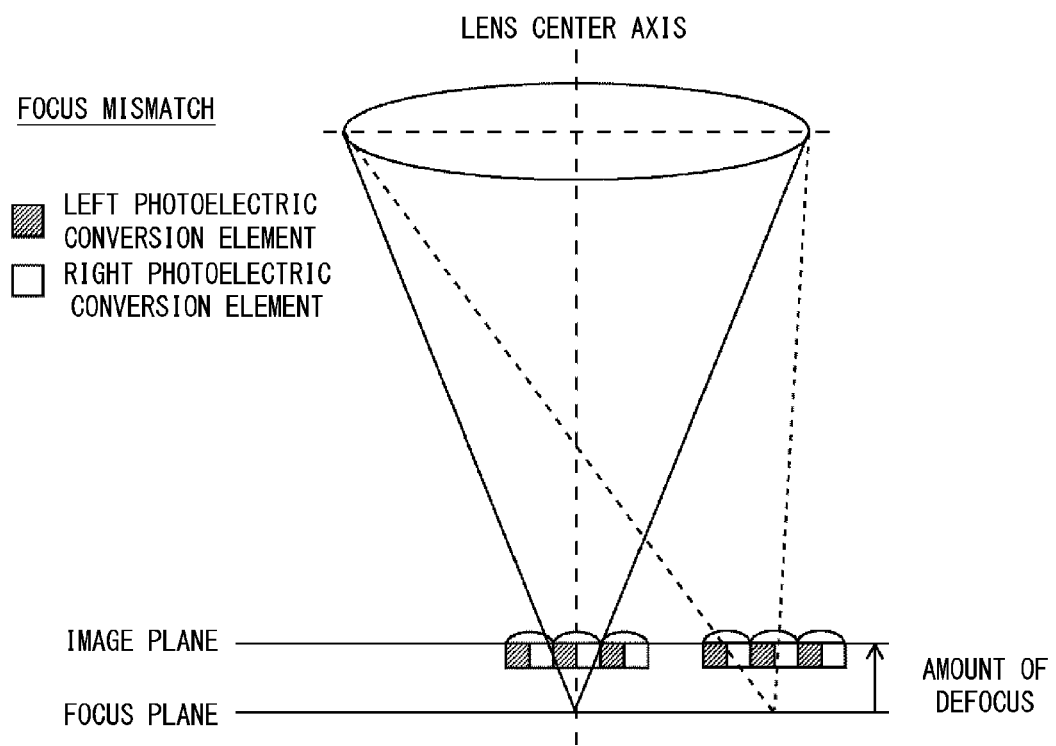
Fig. 6

IMAGE SENSOR

CROSS-REFERENCE TO RELATED APPLICATIONS

This application is based upon and claims the benefit of priority from Japanese patent application No. 2015-016680, filed on Jan. 30, 2015, the disclosure of which is incorporated herein in its entirety by reference.

BACKGROUND

The present invention relates to an image sensor and, for example, to an image sensor with phase detection autofocus feature.

An imaging device such as a camera uses a CCD or CMOS sensor as an image sensor and outputs an image obtained by the image sensor as photographed data. Such an imaging device is often equipped with autofocus feature that automatically enhances the sharpness of an image taken. One technique to implement the autofocus is phase detection autofocus.

In phase detection autofocus, one pair or two pairs of photoreceptors are placed for each of microlenses arranged two-dimensionally, and light of the photoreceptors is projected on the pupil of the imaging optical system using the microlens to thereby divide the pupil. In phase detection autofocus, object images are formed using two light beams that have passed through different parts of the pupil of the imaging optical system, and a positional phase difference between the two object images is detected based on the output of the image sensor and converted into the amount of defocus of the imaging optical system. An example of the imaging device with phase detection autofocus feature as described above is disclosed in Japanese Patent No. 3774597.

SUMMARY

However, because the imaging device disclosed in Japanese Patent No. 3774597 reads a signal of a first photoelectric conversion element and a signal of a second photoelectric conversion element at different timing in a second operation that performs autofocus, there is a problem that the accuracy of autofocus cannot be high enough. The other problems and novel features of the present invention will become apparent from the description of the specification and the accompanying drawings.

According to one embodiment, an image sensor includes a first photoelectric conversion element and a second photoelectric conversion element placed corresponding to one microlens, a first transfer transistor placed corresponding to the first photoelectric conversion element, a second transfer transistor placed corresponding to the second photoelectric conversion element, a read timing signal line that supplies a common read timing signal to the first transfer transistor and the second transfer transistor, a first output line that outputs a signal of the first photoelectric conversion element to the outside, and a second output line that outputs a signal of the second photoelectric conversion element to the outside.

According to one embodiment, it is possible to provide an image sensor capable of implementing autofocus feature that controls focus with high accuracy.

BRIEF DESCRIPTION OF THE DRAWINGS

The above and other aspects, advantages and features will be more apparent from the following description of certain embodiments taken in conjunction with the accompanying drawings, in which:

FIG. 6 is a view illustrating the principle of phase detection autofocus in the image sensor according to the first embodiment.

DETAILED DESCRIPTION

First Embodiment

Figure 1:
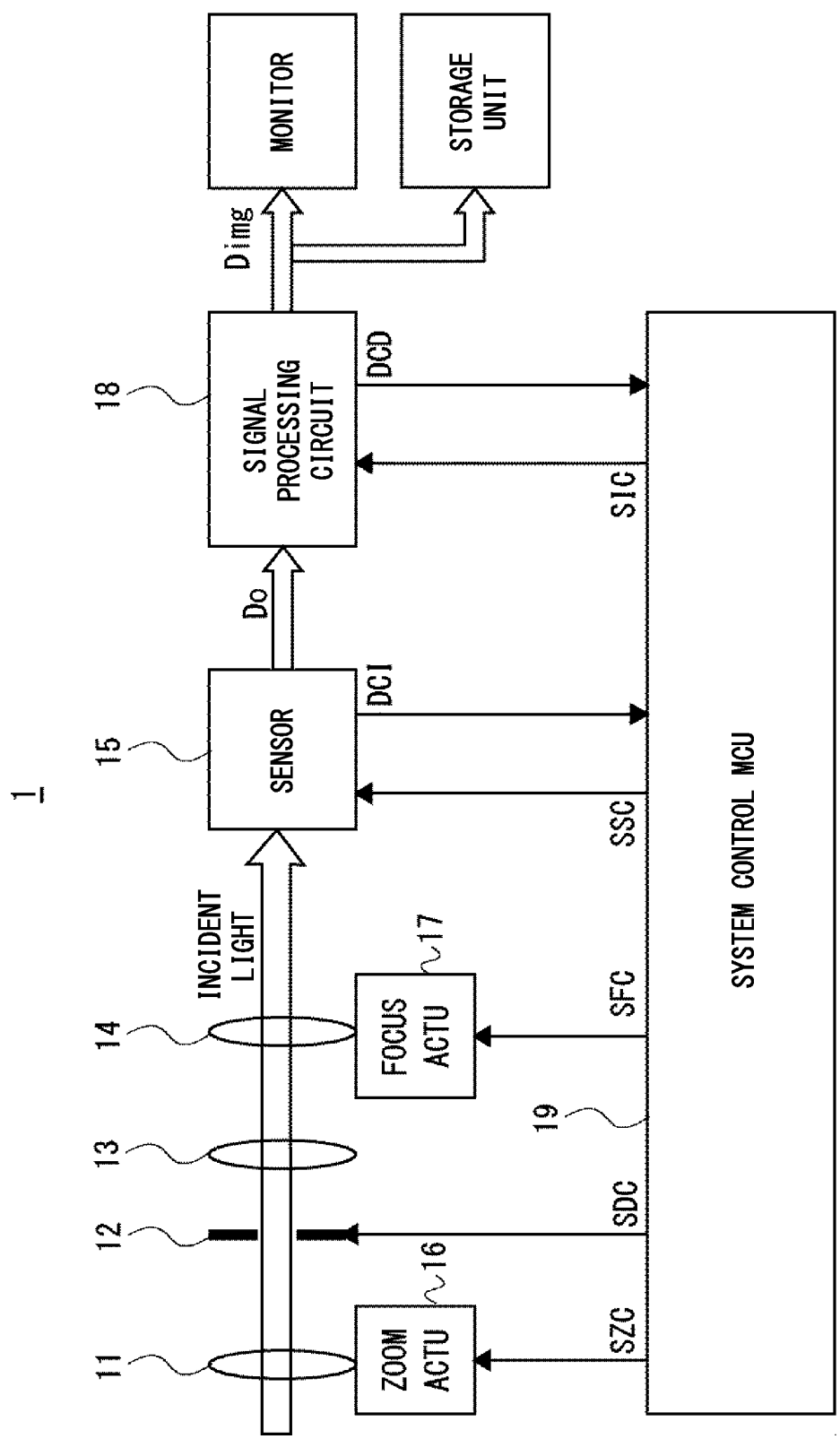
FIG. 1 is a block diagram of a camera system including an image sensor according to a first embodiment.

Exemplary embodiments of the present invention will be explained hereinbelow with reference to the drawings. The following description and the attached drawings are appropriately shortened and simplified to clarify the explanation. Further, elements that are shown as functional blocks for performing various kinds of processing in the drawings may be configured by a CPU, memory or another circuit as hardware or may be implemented by a program loaded to memory or the like as software. It would be thus obvious to those skilled in the art that those functional blocks may be implemented in various forms such as hardware only, software only or a combination of those, and not limited to either one. Note that, in the drawings, the same elements are denoted by the same reference symbols and redundant description thereof is omitted as appropriate.

Further, the above-described program can be stored and provided to the computer using any type of non-transitory computer readable medium. The non-transitory computer readable medium includes any type of tangible storage medium. Examples of the non-transitory computer readable medium include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or optical fiber or a wireless communication line.

<Description on Camera System>

FIG. 1 shows a block diagram of a camera system 1 according to a first embodiment. As shown in FIG. 1, the camera system 1 includes a zoom lens 11, a diaphragm mechanism 12, a fixed lens 13, a focus lens 14, a sensor 15, a zoom lens actuator 16, a focus lens actuator 17, a signal processing circuit 18, a system control MCU 19, a monitor, and a storage unit. The monitor and the storage unit are to check and store images taken by the camera system 1, and they may be placed in another system separated from the camera system 1.

The zoom lens 11, the diaphragm mechanism 12, the fixed lens 13 and the focus lens 14 form a lens group of the camera system 1. The position of the zoom lens 11 is changed by the zoom actuator 16. The position of the focus lens 14 is changed by the focus actuator 17. The camera system 1 changes the zoom magnification and focus by moving the lenses using the respective actuators and changes the amount of incident light by the operation of the diaphragm mechanism 12.

The zoom actuator 16 moves the zoom lens 11 based on a zoom control signal SZC that is output from the system control MCU 19. The focus actuator 17 moves the focus lens 14 based on a focus control signal SFC that is output from the system control MCU 19. The diaphragm mechanism 12 adjusts the f-number by a diaphragm control signal SDC that is output from the system control MCU 19.

The sensor 15 includes a photoreceptor such as a photodiode, for example, and converts photoreceptor pixel information that is obtained from the photoreceptor into a digital value and outputs image information Do. Further, the sensor 15 analyzes the image information Do that is output from the sensor 15 and outputs image feature information DCI representing the feature of the image information Do. The image feature information DCI contains two images that are acquired by autofocus processing, which is described later. Furthermore, the sensor 15 performs gain control of each pixel of the image information Do, exposure control of the image information Do, and HDR (High Dynamic Range) control of the image information Do based on a sensor control signal SSC that is supplied from the signal processing circuit 18. The sensor 15 is described in detail later.

The signal processing circuit 18 performs image processing such as image correction on the image information Do that is received from the sensor 15 and outputs image data Dimg. The signal processing circuit 18 analyzes the received image information Do and outputs color space information DCD. The color space information DCD contains luminance information of the image information Do and color information, for example.

The system control MCU 19 controls the focus of the lens group based on the image feature information DCI that is output from the sensor 15. To be specific, the system control MCU 19 outputs the focus control signal SFC to the focus actuator 17 and thereby controls the focus of the lens group. The system control MCU 19 outputs the diaphragm control signal SDC to the diaphragm mechanism 12 and thereby adjusts the f-number of the diaphragm mechanism 12. Further, the system control MCU 19 generates the zoom control signal SZC according to a zoom instruction that is supplied from the outside and outputs the zoom control signal SZC to the zoom actuator 16, and thereby controls the zoom magnification of the lens group.

To be more specific, the focus is displaced by moving the zoom lens 11 using the zoom actuator 16. The system control MCU 19 calculates a positional phase difference between two object images based on two images contained in the image feature information DCI that is obtained from the sensor 15, and calculates the amount of defocus of the lens group based on the positional phase difference. The system control MCU 19 automatically achieves focus according to the amount of defocus. This processing is called autofocus control.

Further, the system control MCU 19 calculates an exposure control value that instructs exposure setting of the sensor 15 based on luminance information contained in the color space information DCD that is output from the signal processing circuit 18, and controls exposure setting and gain setting of the sensor 15 so that the luminance information contained in the color space information DCD that is output from the signal processing circuit 18 is close to the exposure control value. At this time, the system control MCU 19 may calculate a control value of the diaphragm mechanism 12 when changing the exposure.

Further, the system control MCU 19 outputs a color space control signal SIC for adjusting the luminance or color of the image data Dimg based on an instruction from a user. Note that the system control MCU 19 generates the color space control signal SIC based on a difference between the color space information DCD that is acquired from the signal processing circuit 18 and information that is supplied from the user.

One feature of the camera system 1 according to the first embodiment is a method of controlling the sensor 15 when the sensor 15 acquires the image information Do in autofocus processing. Thus, the sensor 15 is described in detail hereinbelow.

<Description on Operation of Image Sensor>

Figure 2:
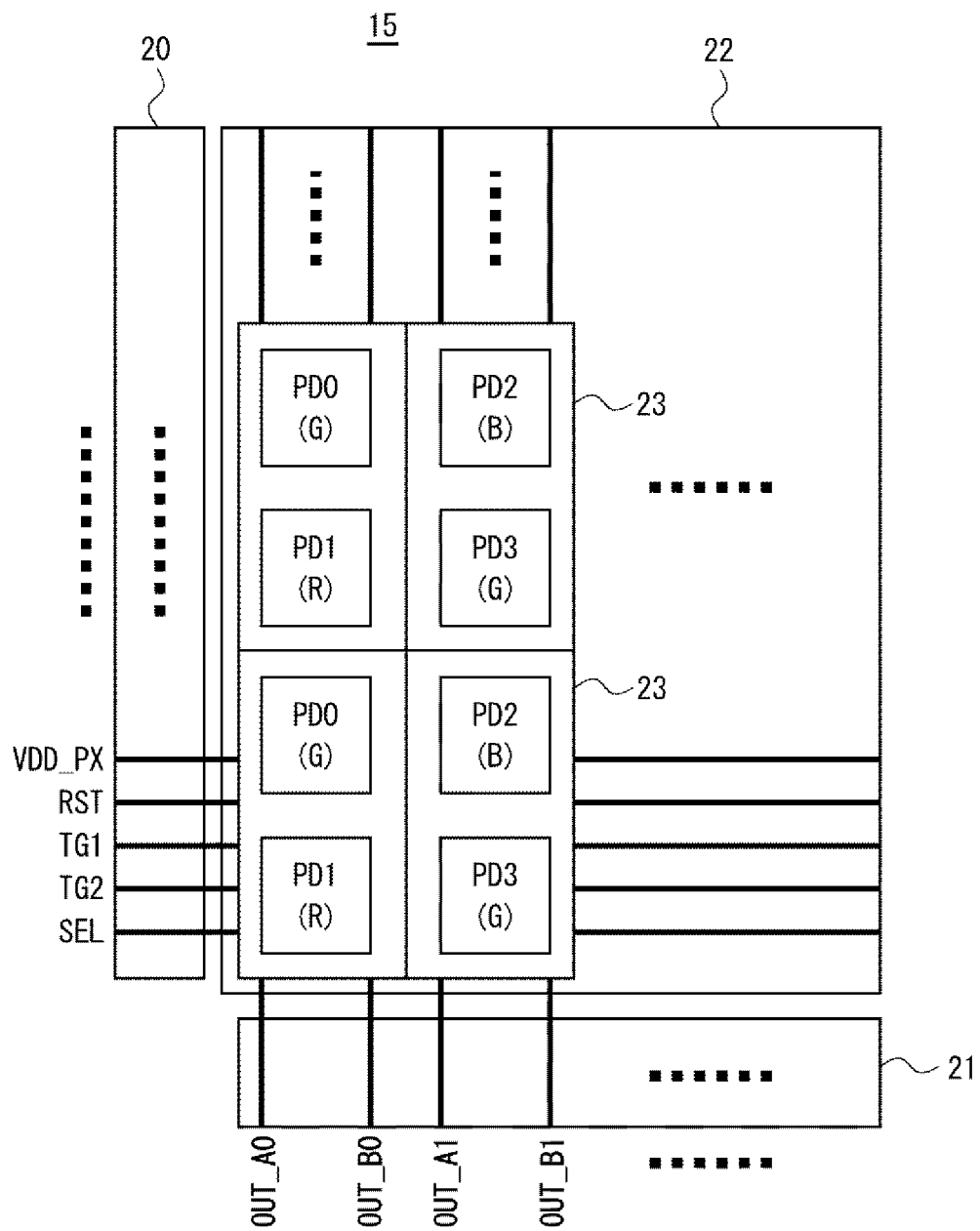
FIG. 2 is a schematic diagram of a floor layout of the image sensor according to the first embodiment.

FIG. 2 is a schematic diagram of a part of a floor layout of the image sensor according to the first embodiment. FIG. 2 shows only the floor layout of a row controller 20, a column controller 21 and a pixel array 22, which is a part of the floor layout of the sensor 15.

The row controller 20 controls the active state of pixel units 23 that are arranged in a lattice on a row-by-row basis. The column controller 21 reads pixel signals read out from the pixel units 23 that are arranged in a lattice on a column-by-column basis. The column controller 21 includes a switch circuit and an output buffer for reading a pixel signal. In the pixel array 22, the pixel units 23 are arranged in a lattice. In the example shown in FIG. 2, each pixel unit 23 includes a photodiode group made up of one or more photodiodes PD in a column direction. To be more specific, each pixel unit 23 is composed of two photodiodes (for example, photodiodes PD0 and PD1 or photodiodes PD2 and PD3). Further, each photodiode has a color filter. In the example of FIG. 2, colors filters are arranged in the Bayer pattern. In the Bayer arrangement, green (G) color filters that largely contribute to a luminance signal are arranged in a checkered pattern, and, in the remaining part, red (R) and blue (B) color filters are arranged in a checkered pattern. Because the pixel array 22 operates on the basis of each pixel unit, the structure and operation of each pixel unit are described hereinafter.

<Description on Circuit of Pixel Unit>

Figure 3:
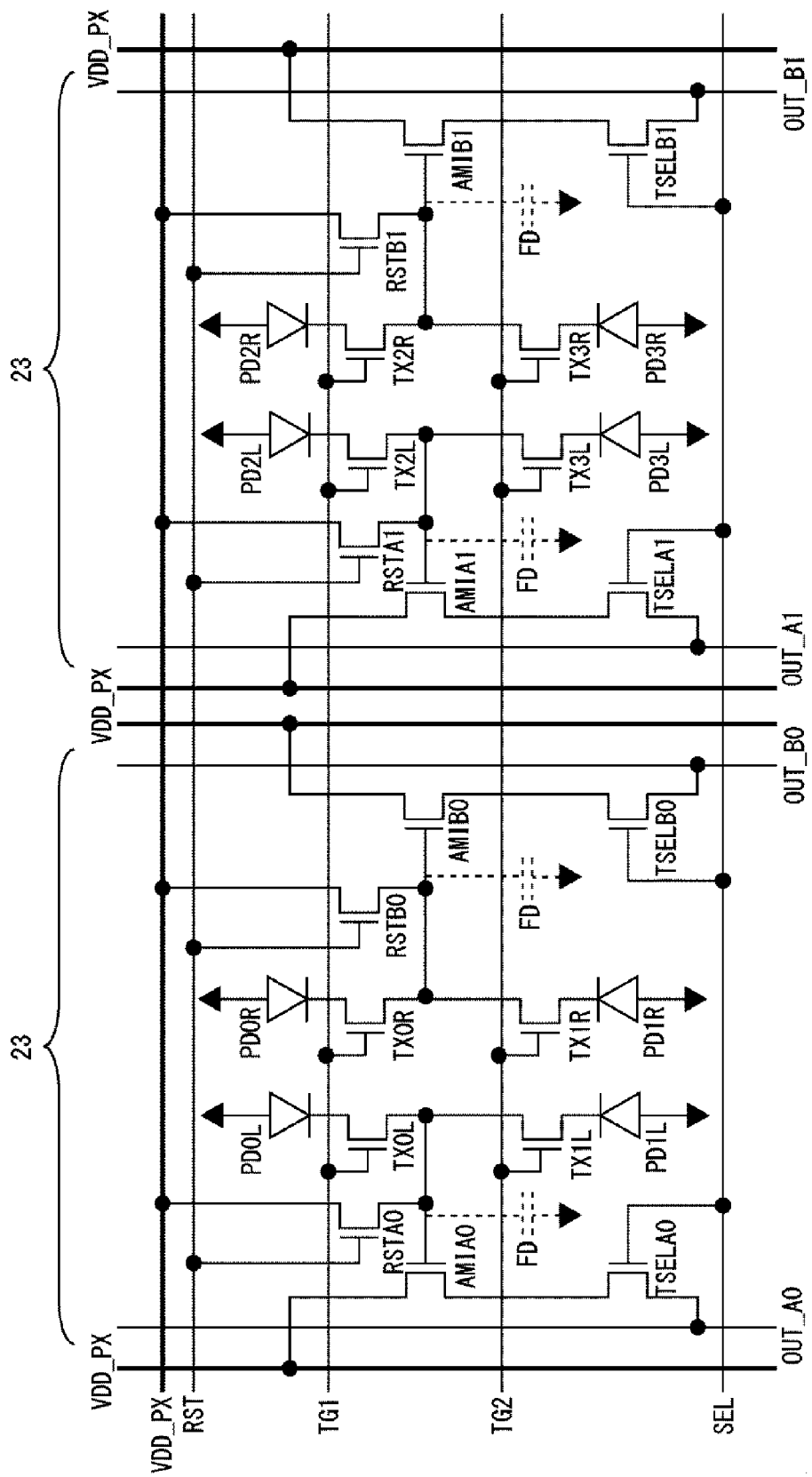
FIG. 3 is a circuit diagram of pixel units of the image sensor according to the first embodiment.

FIG. 3 is a circuit diagram of pixel units of the image sensor according to the first embodiment. In the example shown in FIG. 3, the pixel unit 23 that includes photodiodes PD0 and PD1 and the pixel unit 23 that includes photodiodes PD2 and PD3 are shown. Note that, because the two pixel units 23 are the same except only for output lines, only the pixel unit 23 that includes the photodiodes PD0 and PD1 is described hereinbelow.

As shown in FIG. 3, in the pixel unit 23, a first photoelectric conversion element (for example, a photodiode PD0L) and a second photoelectric conversion element (for example, a photodiode PD0R) constitute one photoreceptor that corresponds to a green color filter. Specifically, as described later, the photodiode PD0L and the photodiode PD0R receive light that enters through a common microlens. Further, the photodiode PD0L and the photodiode PD0R are placed adjacent to each other.

Further, in the pixel unit 23, a third photoelectric conversion element (for example, a photodiode PD1L) and a fourth photoelectric conversion element (for example, a photodiode PD1R) constitute one photoreceptor that corresponds to a red color filter. The photodiode PD1L and the photodiode PD1R receive light that enters through a common microlens. Further, the photodiode PD1L and the photodiode PD1R are placed adjacent to each other.

In the pixel unit 23, a first transfer transistor (for example, a transfer transistor TX0L) is placed for the photodiode PD0L, and a second transfer transistor (for example, a transfer transistor TX0R) is placed for the photodiode PD0R. A first read timing signal line TG1 for supplying a common first read timing signal is connected to the gates of the transfer transistor TX0L and the transfer transistor TX0R. Further, in the pixel unit 23, a third transfer transistor (for example, a transfer transistor TX1L) is placed for the photodiode PD1L, and a fourth transfer transistor (for example, a transfer transistor TX1R) is placed for the photodiode PD1R. A second read timing signal line TG2 for supplying a common second read timing signal is connected to the gates of the transfer transistor TX1L and the transfer transistor TX1R. The second read timing signal is enabled at different timing from the first read timing signal.

The drains of the transfer transistors TX0L and TX1L form a floating diffusion FD. The drains of the transfer transistors TX0L and TX1L are connected to the gate of a first amplification transistor (for example, an amplification transistor AMIA0). Further, the drains of the transfer transistors TX0L and TX1L are connected to the source of a first reset transistor (for example, a reset transistor RSTA0). A power supply voltage is applied to the drain of the reset transistor RSTA0 through a power supply line VDD_PX. The amplification transistor AMIA0 amplifies a first voltage that is generated by the charge which is output through the transfer transistors TX0L and TX1L and outputs it to a first output line OUT_A0. To be more specific, the drain of the amplification transistor AMIA0 is connected to the power supply line VDD_PX, and the source of the amplification transistor AMIA0 is connected to the first output line OUT_A0 through a first selection transistor (for example, a selection transistor TSELA0). The first output line OUT_A0 outputs an output signal that is generated based on the charge which is read through the transfer transistors TX0L and TX1L. Note that a selection signal line SEL for supplying a selection signal is connected to the gate of the selection transistor TSELA0.

The drains of the transfer transistors TX0R and TX1R form a floating diffusion FD. The drains of the transfer transistors TX0R and TX1R are connected to the gate of a second amplification transistor (for example, an amplification transistor AMIB0). Further, the drains of the transfer transistors TX0R and TX1R are connected to the source of a second reset transistor (for example, a reset transistor RSTB0). A power supply voltage is applied to the drain of the reset transistor RSTB0 through the power supply line VDD_PX. The amplification transistor AMIB0 amplifies a second voltage that is generated by the charge which is output through the transfer transistors TX0R and TX1R and outputs it to a second output line OUT_B0. To be more specific, the drain of the amplification transistor AMIB0 is connected to the power supply line VDD_PX, and the source of the amplification transistor AMIB0 is connected to the second output line OUT_B0 through a second selection transistor (for example, a selection transistor TSELB0). The second output line OUT_B0 outputs an output signal that is generated based on the charge which is read through the transfer transistors TX0R and TX1R. Note that a selection signal line SEL for supplying a selection signal is connected to the gate of the selection transistor TSELB0.

<Description on Layout of Pixel Unit>

Figure 4:
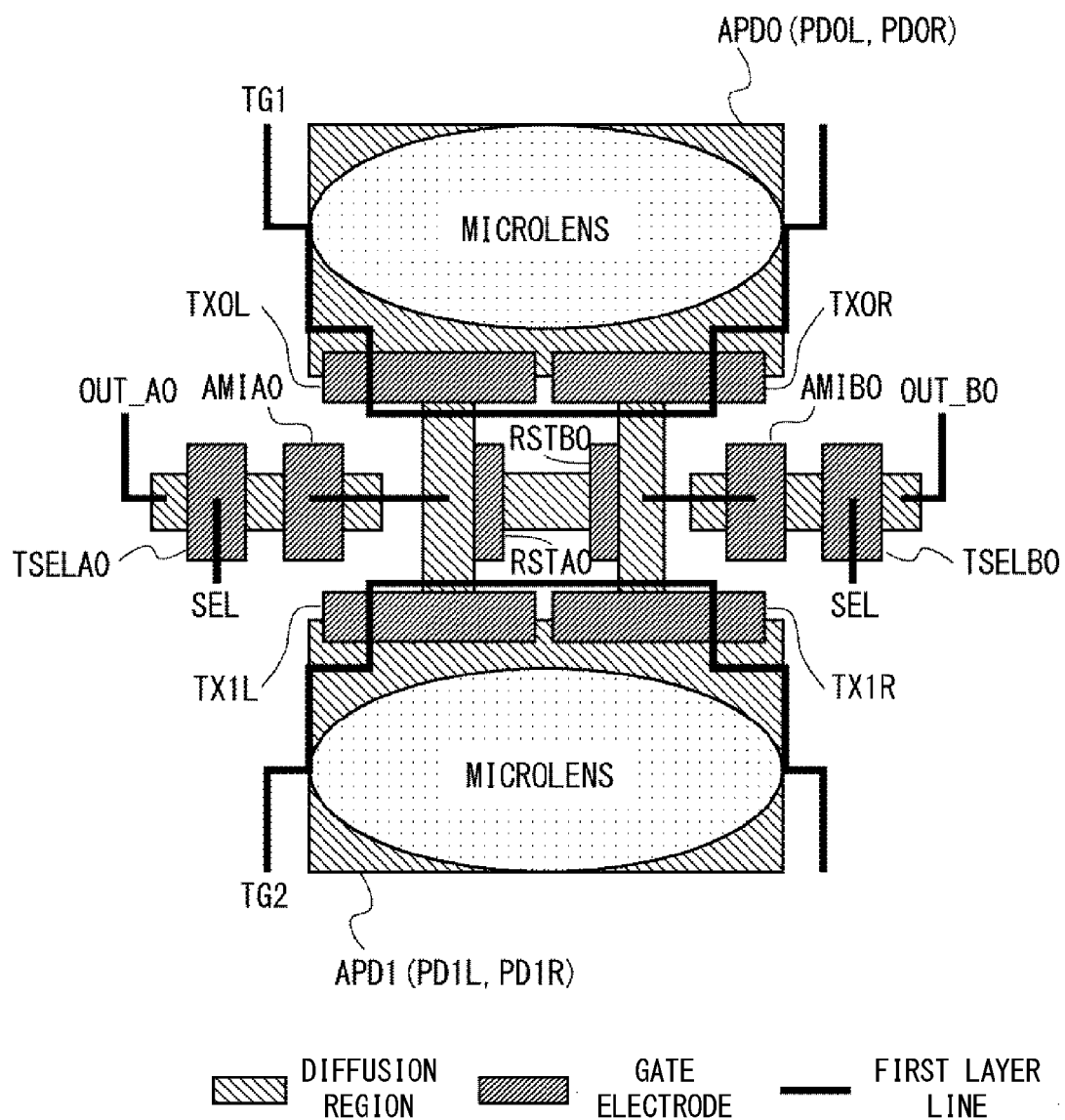
FIG. 4 is a schematic diagram of a layout of the pixel unit of the image sensor according to the first embodiment.

The layout of the pixel unit 23 according to the first embodiment is described hereinafter. FIG. 4 is a schematic diagram of the layout of the pixel unit 23 according to the first embodiment. Note that the layout of FIG. 4 shows only one pixel unit. Further, in FIG. 4, the illustration of the power supply line VDD_PX is omitted.

As shown in FIG. 4, the pixel unit 23 includes a first photoelectric conversion element region APD0 and a second photoelectric conversion element region APD1. In the first photoelectric conversion element region APD0, a first left photoelectric conversion element (for example, the photodiode PD0L) and a first right photoelectric conversion element (for example, the photodiode PD0R) are formed below one microlens. In the second photoelectric conversion element region APD1, a second left photoelectric conversion element (for example, the photodiode PD1L) and a second right photoelectric conversion element (for example, the photodiode PD1R) are formed below one microlens.

Further, the transfer transistor TX0L is formed on the side of the first photoelectric conversion element region APD0 which faces the second photoelectric conversion element region APD1, the first read timing signal line TG1 is connected to its gate, and it is placed corresponding to the photodiode PD0L. The transfer transistor TX0R is formed on the side of the first photoelectric conversion element region APD0 which faces the second photoelectric conversion element region APD1, the first read timing signal line TG1 is connected to its gate, and it is placed corresponding to the photodiode PD0R. The transfer transistor TX1L is formed on the side of the second photoelectric conversion element region APD1 which faces the first photoelectric conversion element region APD0, the second read timing signal line TG2 is connected to its gate, and it is placed corresponding to the photodiode PD1L. The transfer transistor TX1R is formed on the side of the second photoelectric conversion element region APD1 which faces the first photoelectric conversion element region APD0, the second read timing signal line TG2 is connected to its gate, and it is placed corresponding to the photodiode PD1R.

Further, in the pixel unit 23, a diffusion region that serves as the drain of the transfer transistor TX0L and a diffusion region that serves as the drain of the transfer transistor TX1L are formed in one region, and this region serves as a first floating diffusion region. In other words, the first floating diffusion region is formed in a region where the transfer transistor TX0L and the transfer transistor TX1L are connected. Further, in the pixel unit 23, a diffusion region that serves as the drain of the transfer transistor TX0R and a diffusion region that serves as the drain of the transfer transistor TX1R are formed in one region, and this region serves as a second floating diffusion region. In other words, the second floating diffusion region is formed in a region where the transfer transistor TX0R and the transfer transistor TX1R are connected.

Further, in the pixel unit 23, the first reset transistor (for example, the reset transistor RSTA0) is formed adjacent to the first floating diffusion region, and the second reset transistor (for example, the reset transistor RSTB0) is formed adjacent to the second floating diffusion region. Diffusion regions that serve as the sources of the reset transistor RSTA0 and the reset transistor RSTB0 are formed in one region.

Further, in the pixel unit 23, the amplification transistors and the selection transistors are formed in the region between the first photoelectric conversion element region APD0 and the second photoelectric conversion element region APD1. To be more specific, in the pixel unit 23, the amplification transistor AMIA0 and the selection transistor TSELA0 are formed in the left-side region of the first floating diffusion region in FIG. 4. The gate of the amplification transistor AMIA0 is connected to the first floating diffusion region by using a line formed by a first layer line. The source of the amplification transistor AMIA0 and the drain of the selection transistor TSELA0 are formed in one region. The first output line OUT_A0 is connected to the diffusion region that forms the source of the selection transistor TSELA0. Further, in the pixel unit 23, the amplification transistor AMIB0 and the selection transistor TSELB0 are formed in the right-side region of the second floating diffusion region in FIG. 4. The gate of the amplification transistor AMIB0 is connected to the second floating diffusion region by using a line formed by the first layer line. The source of the amplification transistor AMIB0 and the drain of the selection transistor TSELB0 are formed in one region. The second output line OUT_B0 is connected to the diffusion region that forms the source of the selection transistor TSELB0.

<Description on Cross-Sectional Structure of Pixel Unit>

Figure 5:
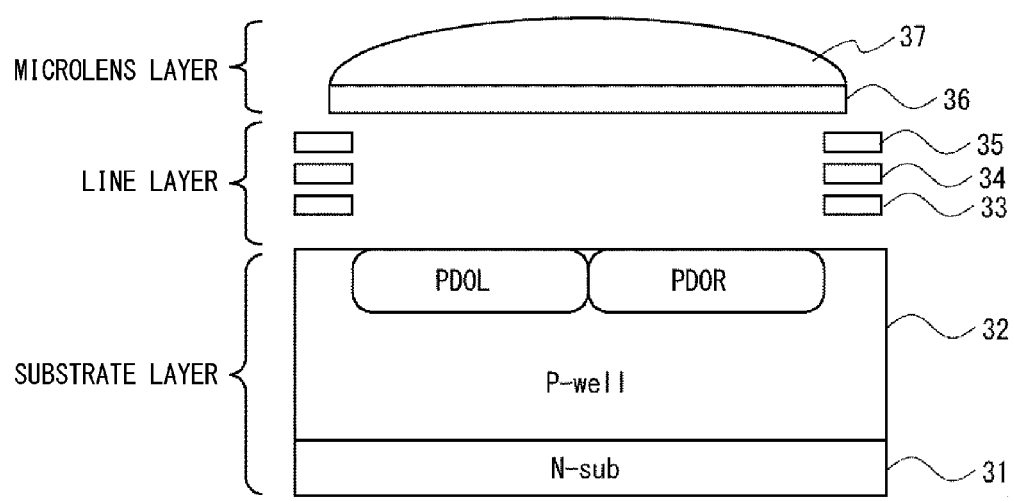
FIG. 5 is a cross-sectional view of a photodiode part of the image sensor according to the first embodiment.

The cross-sectional structure of the first photoelectric conversion element region APD0 in the pixel unit 23 is described hereinafter. FIG. 5 is a cross-sectional view of a photodiode part included in the first photoelectric conversion element region APD0 of the image sensor according to the first embodiment. As shown in FIG. 5, in the pixel unit 23, a P-well layer 32 is formed above an N sub-layer 31, and the photodiodes PD0L and PD0R are formed on the surface of the P-well layer 32. Further, a line layer where lines 33 to 35 are formed are placed above a substrate layer composed of the N sub-layer 31 and the P-well layer 32. A microlens in the pixel unit 23 is formed in a layer above the line layer. In a microlens layer in which the microlens is formed, a microlens 37 is formed above a color filter 36. As shown in FIG. 5, the microlens 37 is formed to cover a pair of photodiodes in the pixel unit 23.

<Description on Focus of Camera System>

The focus in the camera system 1 is described hereinafter. FIG. 6 is a view illustrating the principle of phase detection autofocus in the image sensor according to the first embodiment. FIG. 6 shows the positional relationship between an evaluation plane (for example, an image plane) formed on the sensor surface and a focus plane on which the image of light entering through the focus lens is focused.

As shown in FIG. 6, when it is in focus, the focus plane on which the image of light entering through the focus lens is focused matches the image plane (the upper part of FIG. 6). On the other hand, when it is out of focus, the focus plane on which the image of light entering through the focus lens is focused is formed at a position different from the image plane (the lower part of FIG. 6). The amount of displacement between the focus plane and the image plane is the amount of defocus.

Figure 7:
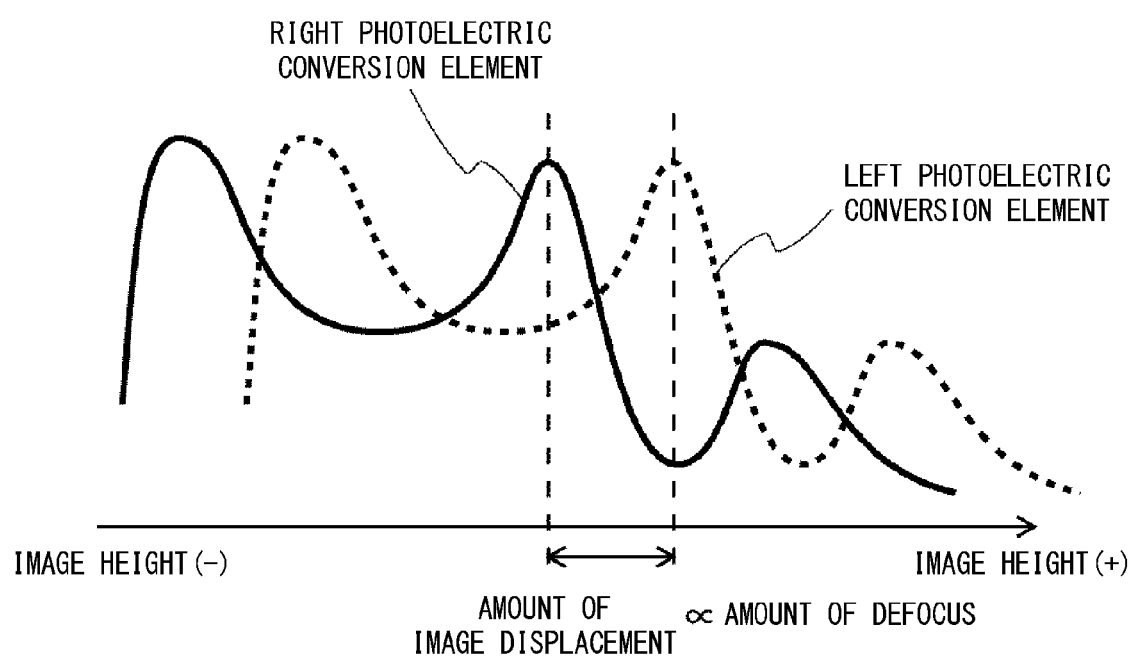
FIG. 7 is a graph illustrating outputs of photoelectric conversion elements when defocus occurs in the image sensor according to the first embodiment.

An image that is formed on the image plane when defocus occurs is described hereinafter. FIG. 7 is a graph illustrating outputs of photoelectric conversion elements when defocus occurs. In FIG. 7, the horizontal axis represents the image height indicating the distance from the lens center axis of the photoelectric conversion element, and the vertical axis represents the value of the output of the photoelectric conversion element.

As shown in FIG. 7, when defocus occurs, a signal that is output from the left photoelectric conversion element and a signal that is output from the right photoelectric conversion element are displaced in the direction of the image height. The amount of image displacement is a value proportional to the amount of defocus. Thus, the camera system 1 according to the first embodiment calculates the amount of defocus based on the amount of image displacement and thereby determines the position of the focus lens 14.

The autofocus processing of the camera system 1 according to the first embodiment controls the position of the focus lens 14 so that output signals that are output from all pixel units placed in the pixel array 22 of the sensor 15 match between the left photoelectric conversion element and the right photoelectric conversion element. Further, in the camera system 1 according to the first embodiment, the system control MCU 19 controls the position of the focus lens 14 based on resolution information that is output from the sensor 15.

<Description on Autofocus Control>

Figure 8:
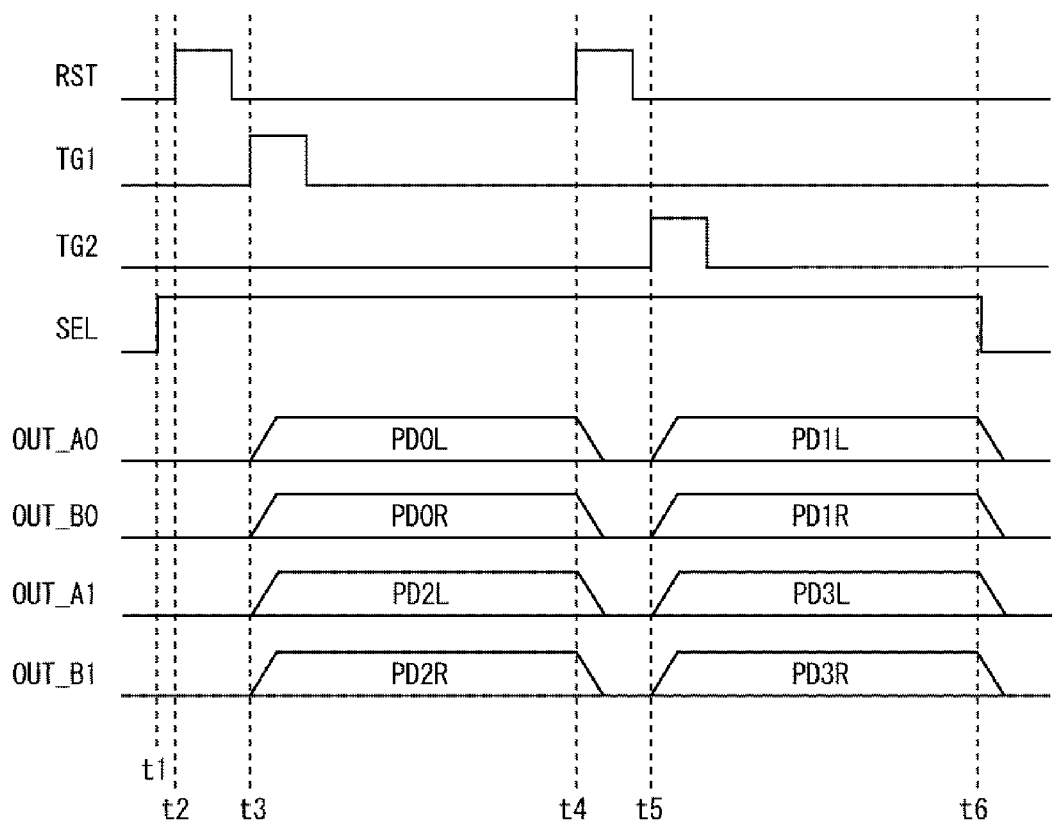
FIG. 8 is a timing chart showing an operation for autofocus control of the image sensor according to the first embodiment.

An operation for autofocus processing of the sensor 15 according to the first embodiment is described hereinafter. FIG. 8 is a timing chart showing an operation for autofocus control of the image sensor according to the first embodiment. Note that, in the description of FIG. 8, a symbol indicating each line is used also to indicate a signal transmitted through that line.

As shown in FIG. 8, in the sensor 15, a selection signal SEL is switched from Low level to High level at timing t1. The selection transistors TSELA0, TSELB0, TSELA1 and TSELB1 are thereby conducted. Next, at timing t2, a reset signal RST is raised from Low level to High level. Each floating diffusion FD is thereby reset. Then, after the reset signal is switched back to Low level, a first read timing signal TG1 is raised at timing t3. An output signal based on the charge which is output from the photodiode PD0L is thereby output to the first output line OUT_A0, and an output signal based on the charge which is output from the photodiode PD0R is thereby output to the second output line OUT_B0. Further, an output signal based on the charge which is output from the photodiode PD2L is thereby output to the first output line OUT_A1, and an output signal based on the charge which is output from the photodiode PD2R is thereby output to the second output line OUT_B1.

Then, at timing t4, the reset signal RST is raised from Low level to High level. Each floating diffusion FD is thereby reset. Then, after the reset signal is switched back to Low level, a second read timing signal TG2 is raised at timing t5. An output signal based on the charge which is output from the photodiode PD1L is thereby output to the first output line OUT_A0, and an output signal based on the charge which is output from the photodiode PD1R is thereby output to the second output line OUT_B0. Further, an output signal based on the charge which is output from the photodiode PD3L is thereby output to the first output line OUT_A1, and an output signal based on the charge which is output from the photodiode PD3R is thereby output to the second output line OUT_B1. Then, at timing t6, the selection signal SEL is switched from High level to Low level.

As described above, in the sensor 15 according to the first embodiment, outputs from the left photoelectric conversion element and the right photoelectric conversion element placed corresponding to one microlens are done by activating one read timing signal. In other words, in the sensor 15 according to the first embodiment, outputs from the left photoelectric conversion element and the right photoelectric conversion element placed corresponding to one microlens are made in one timing. It is thereby possible to enhance the accuracy of autofocus control in the sensor 15 according to the first embodiment. The accuracy of autofocus control is described hereinafter using a comparative example.

<Description on Difference in Autofocus Control Using Comparative Example>

Figure 9:
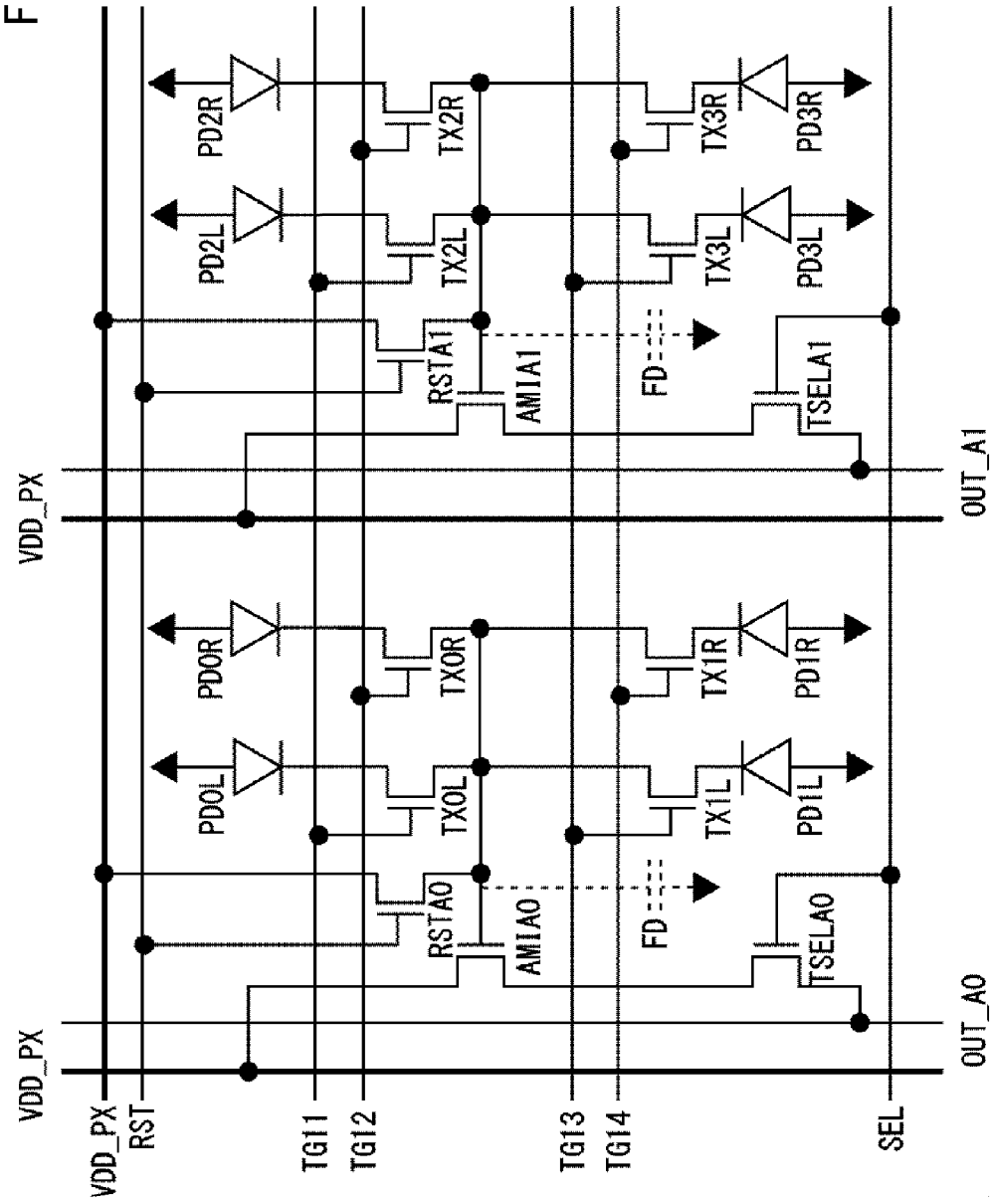
FIG. 9 is a circuit diagram of pixel units of an image sensor according to a comparative example.

A pixel unit according to a comparative example is described first. FIG. 9 is a circuit diagram of pixel units according to a comparative example. FIG. 9 shows two pixel units just like the circuit diagram shown in FIG. 3.

As shown in FIG. 9, in the pixel unit according to the comparative example, a pair of photoelectric conversion elements including two photoelectric conversion elements placed below one microlens are placed just like in the pixel unit 23 according to the first embodiment, and two sets of the pair of photoelectric conversion elements are placed. The charge from four photodiodes placed in one pixel unit is output to the output line through one amplification transistor. Further, in the pixel unit according to the comparative example, four read timing signals (for example, read timing signal lines TG11 to TG14) are placed for one pixel unit. In the pixel unit according to the comparative example, the charge which is accumulated in four photodiodes is sequentially read out through the read timing signal lines TG11 to TG14.

Figure 10:
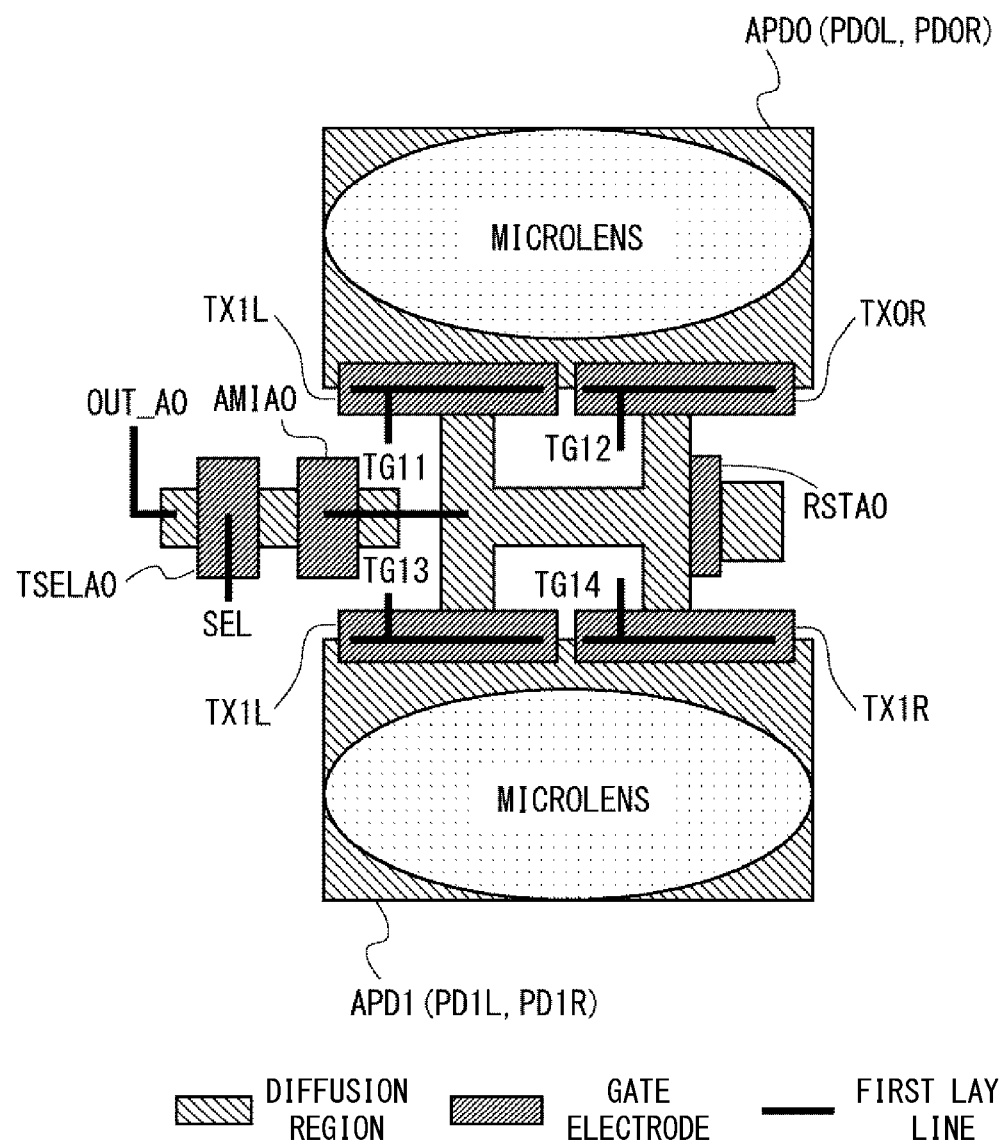
FIG. 10 is a schematic diagram of a layout of the pixel unit of the image sensor according to the comparative example.

The layout of the pixel unit according to the comparative example is described hereinafter. FIG. 10 is a schematic diagram of the layout of the pixel unit of the image sensor according to the comparative example. As shown in FIG. 10, in the pixel unit according to the comparative example, the reset transistor is only the reset transistor RSTA0. Further, in the pixel unit according to the comparative example, a voltage that is generated by the charge which is output from the photodiodes in the pixel unit is obtained from the first output line OUT_A0 through the amplification transistor AMIA0. Therefore, the pixel unit according to the comparative example does not include the amplification transistor AMIB0 and the selection transistor TSELB0 in the pixel unit 23 according to the first embodiment shown in FIG. 4.

Figure 11:
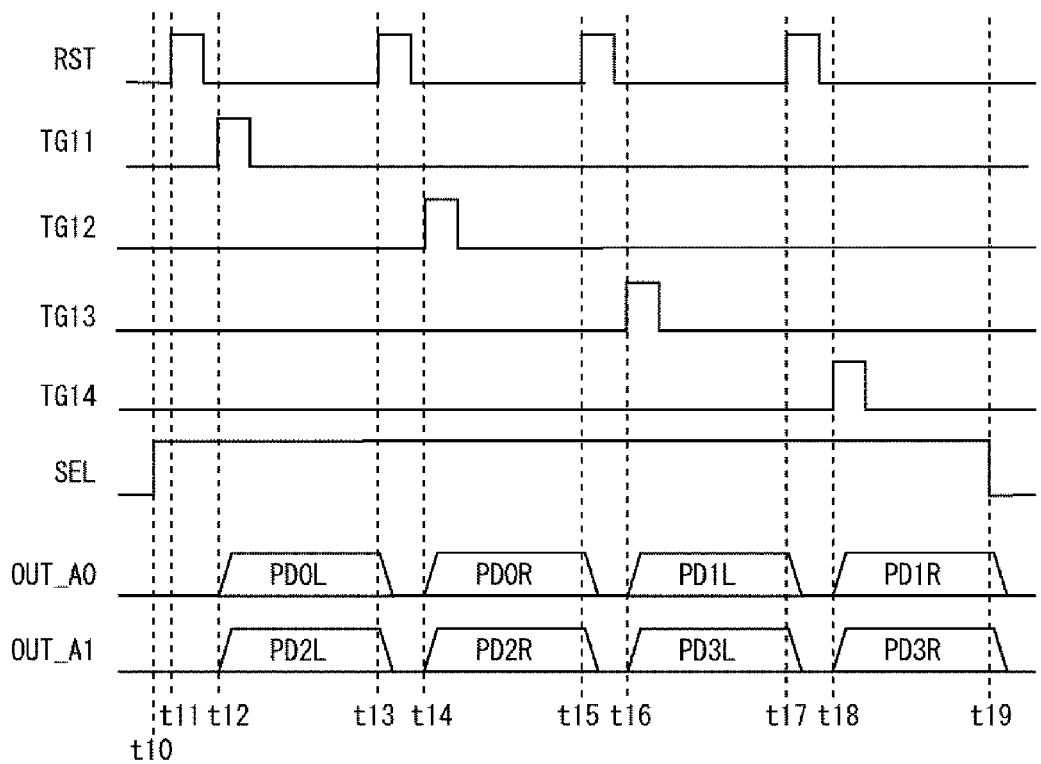
FIG. 11 is a timing chart showing an operation for autofocus control of the image sensor according to the comparative example.

The operation of the pixel unit according to the comparative example is described next. FIG. 11 is a timing chart showing an operation for autofocus control of the image sensor according to the comparative example. Note that, in the description of FIG. 11, a symbol indicating each line is used also to indicate a signal transmitted through that line.

As shown in FIG. 11, in the pixel unit according to the comparative example, the selection signal SEL is set to High level at timing t10, and thereby the selection transistor that belongs to a row to be read is switched to the conducted state. Next, the reset signal RST is switched to High level at timing t11, and thereby the floating diffusion is reset. Then, after the reset signal RST is switched to Low level, the read timing signal TG11 is set to High level at timing t12, and thereby an output signal that is generated based on the charge which is output from the photodiode PD0L is output to the output line OUT_A0, and an output signal that is generated based on the charge which is output from the photodiode PD2L is output to the output line OUT_A1.

After that, in the pixel unit according to the comparative example, the reset signal RST and the read timing signals TG12 to TG14 are switched, and thereby outputs from the photodiode PD0R, the photodiode PD1L and the photodiode PD1R are read out through the output line OUT_A0. Further, in the pixel unit according to the comparative example, the reset signal RST and the read timing signals TG12 to TG14 are switched, and thereby outputs from the photodiode PD2R, the photodiode PD3L and the photodiode PD3R are read out through the output line OUT_A1.

Figure 12:
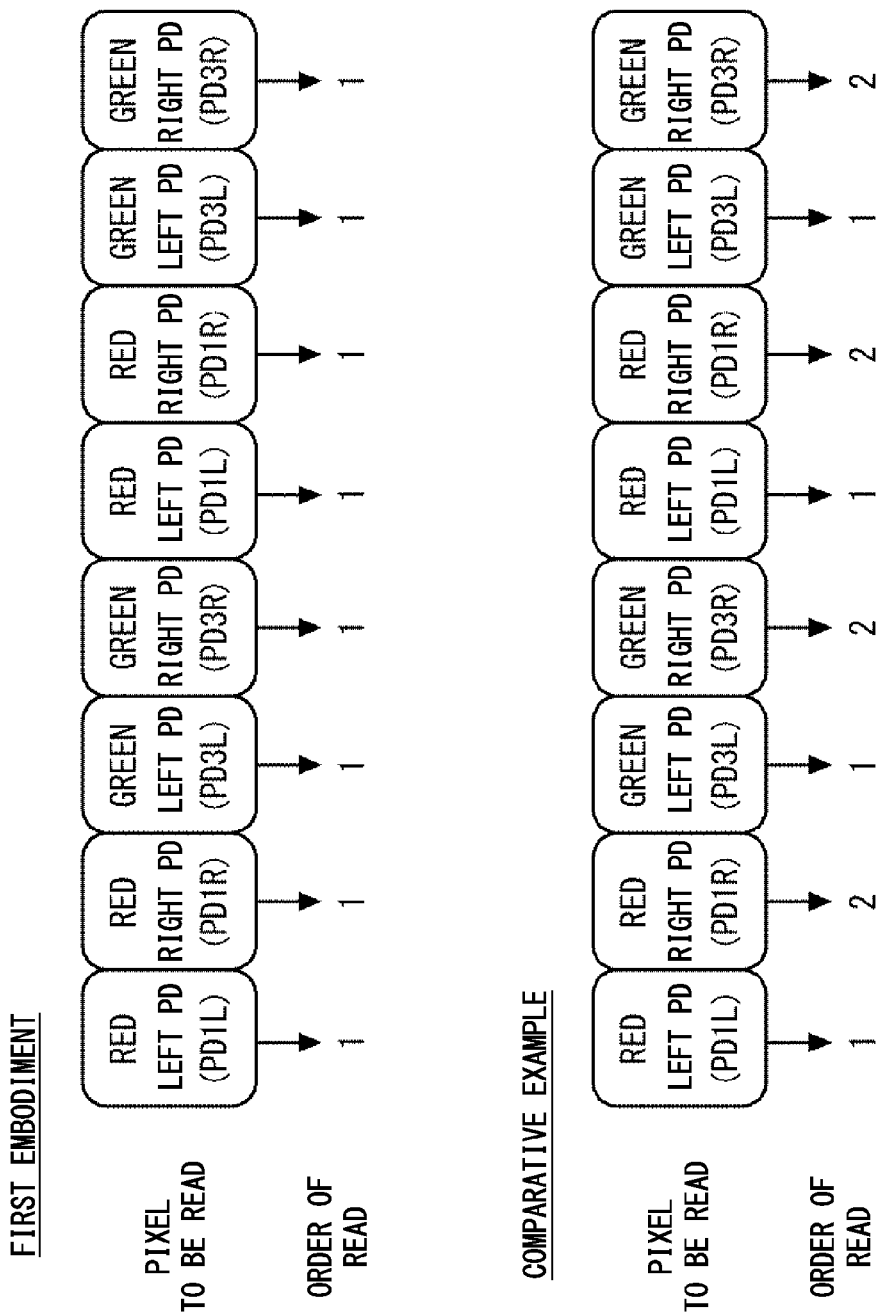
FIG. 12 is a view illustrating a difference in timing of reading pixel information between the image sensor according to the first embodiment and the image sensor according to the comparative example.

As described above, in the pixel unit according to the comparative example, the charge which is accumulated in the two photodiodes placed below one microlens are read out at different timing. The read timing of pixels in the pixel unit according to the first embodiment and the pixel unit according to the comparative example is described hereinbelow. FIG. 12 is a view illustrating a difference in timing of reading pixel information between the image sensor according to the first embodiment and the image sensor according to the comparative example. FIG. 12 shows an example of obtaining output signals from a row in which photodiodes corresponding to a red color filter and photodiodes corresponding to a green color filter are arranged.

As shown in FIG. 12, in the pixel unit according to the first embodiment, output signals can be obtained from photodiodes that belong to the row to be read in one time of read operation. On the other hand, in the pixel unit according to the comparative example, two times of read operations are required to obtain output signals from all photodiodes that belong to the row to be read.

Figure 13:
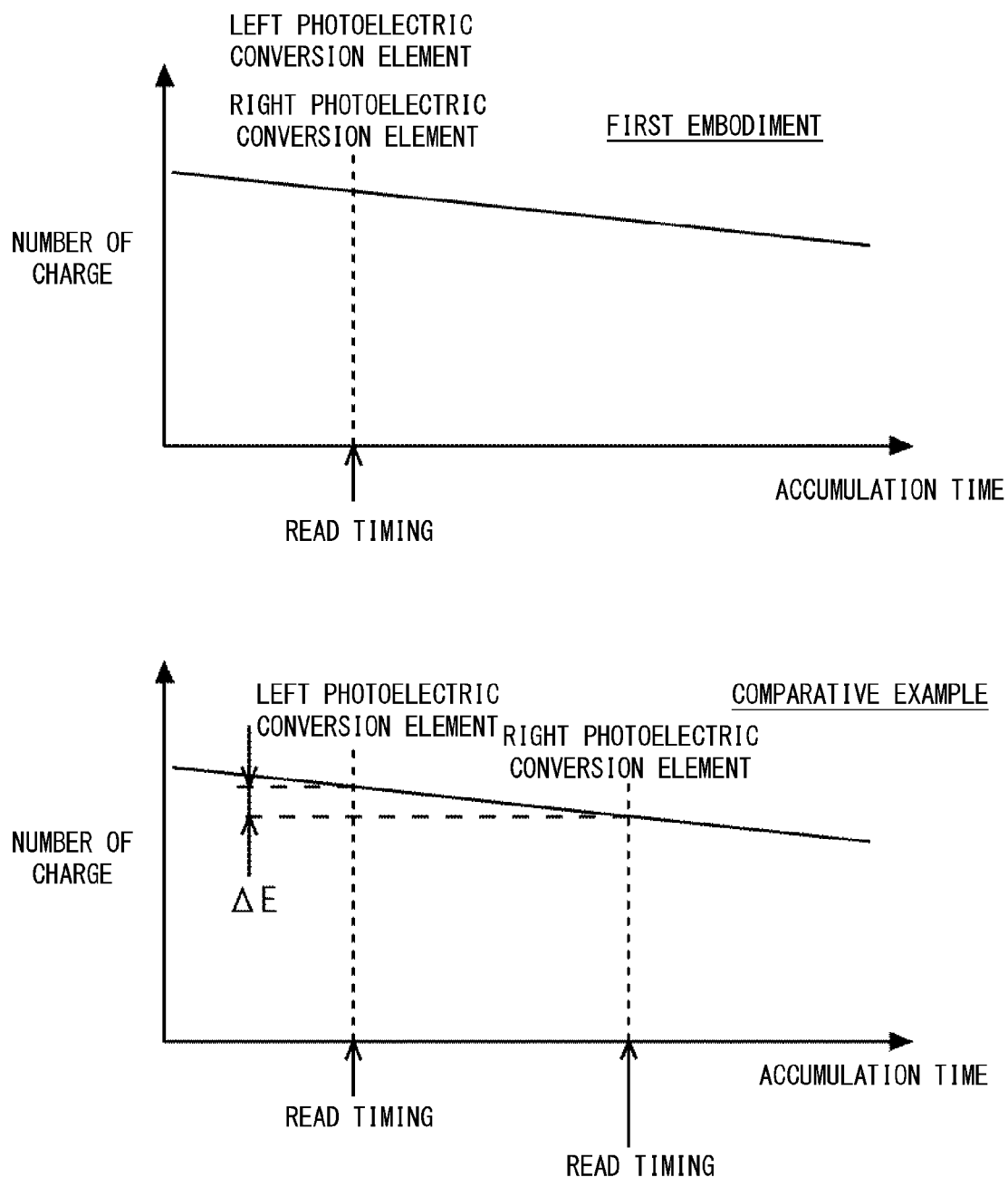
FIG. 13 is a view comparing a difference in photodiode output due to a difference in timing of reading pixel information between the image sensor according to the first embodiment and the image sensor according to the comparative example.

Photodiodes have characteristics that charge which is accumulated by receiving light decreases with time. Therefore, the output that can be read out of the photodiodes, which have the same amount of charge at first, differs depending on a difference in read timing. FIG. 13 is a view comparing a difference in photodiode output due to a difference in timing of reading pixel information between the image sensor according to the first embodiment and the image sensor according to the comparative example.

As shown in FIG. 13, in the pixel unit 23 according to the first embodiment, the charge accumulated in the photodiodes is read at one timing. Therefore, in the pixel unit according to the first embodiment, if the initial amount of charge accumulated is the same, the output based on the same amount of charge can be obtained. On the other hand, in the pixel unit 23 according to the comparative example, the charge accumulated in the photodiodes is read at different timing. Therefore, in the pixel unit according to the comparative example, even if the initial amount of charge accumulated is the same, there is a difference ΔE between the charge which is read from the left photoelectric conversion element and the charge which is read from the right photoelectric conversion element. Accordingly, in the pixel unit according to the comparative example, even if the initial amount of charge accumulated is the same, the output based on the same amount of charge cannot be obtained from the left photoelectric conversion element and the right photoelectric conversion element.

As described above, in the case of performing autofocus processing using the sensor that includes the pixel units according to the comparative example, a difference arises between the outputs obtained from the left photoelectric conversion element and the right photoelectric conversion element that are formed below one microlens in the image acquired at an in-focus point as well. Therefore, in the case of using the sensor that includes the pixel units according to the comparative example, the position of the focus lens where it is determined to be in-focus is displaced from the actual in-focus point.

On the other hand, in the sensor 15 according to the first embodiment, because the output signals are obtained at one timing from the left photoelectric conversion element and the right photoelectric conversion element that are formed below one microlens, no difference arises between the output signals acquired from the left photoelectric conversion element and the right photoelectric conversion element which are obtained at an in-focus point. Therefore, in the camera system 1 using the sensor 15 according to the first embodiment, it is possible to accurately set the position of the focus lens at an in-focus point. Accordingly, the camera system 1 using the sensor 15 according to the first embodiment can perform autofocus processing with high accuracy.

Further, in the sensor 15 according to the first embodiment, because the output signals are obtained at one timing from the left photoelectric conversion element and the right photoelectric conversion element that are formed below one microlens, it is possible to shorten the time required to acquire an image in autofocus processing compared with the sensor that includes the pixel unit according to the comparative example.

Second Embodiment

Figure 14:
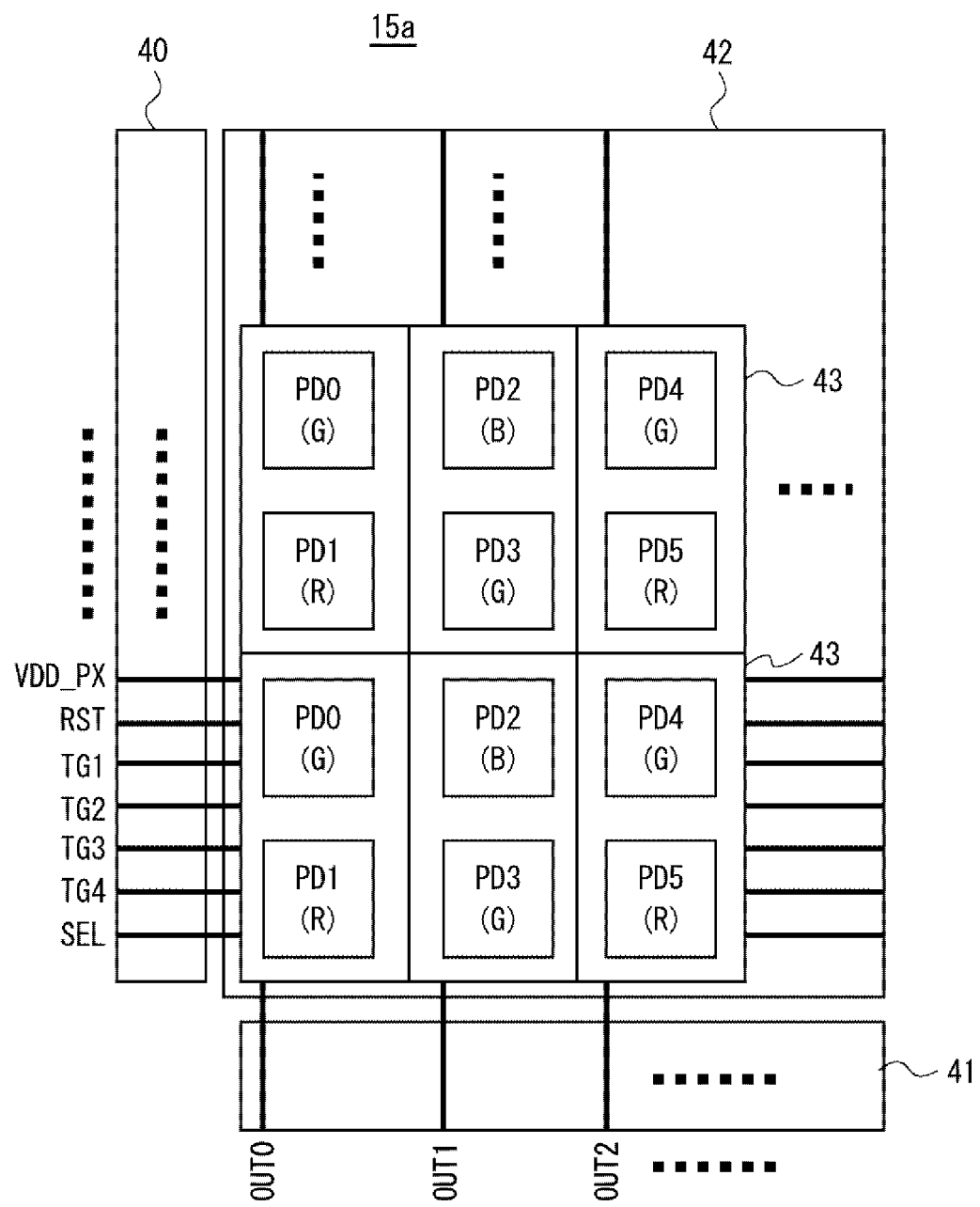
FIG. 14 is a schematic diagram of a floor layout of an image sensor according to a second embodiment.

In a second embodiment, a sensor 15a, which is an alternative example of the sensor 15 according to the first embodiment, is described. FIG. 14 is a schematic diagram of the floor layout of the sensor 15a according to the second embodiment. FIG. 14 shows only the floor layout of a row controller 40, a column controller 41 and a pixel array 42, which is a part of the floor layout of the sensor 15a.

As shown in FIG. 14, the sensor 15a includes the row controller 40, the column controller 41 and the pixel array 42. Although the row controller 40 is substantially the same as the row controller 20, it is different from the row controller 20 in that it outputs a first read timing signal to a fourth read timing signal as read timing signals. Although the column controller 41 is substantially the same as the column controller 21, it is different from the column controller 21 in that the number of output signals acquired from the pixel units arranged in the same column is one.

In the pixel array 42, pixel units 43 are arranged in a lattice. In the example shown in FIG. 14 also, each pixel unit 43 includes a photodiode group made up of one or more photodiodes PD in a column direction. To be more specific, each pixel unit 43 is composed of two photodiodes. Note that each of the photodiodes shown in FIG. 14 includes two photodiodes (for example, a left photoelectric conversion element and a right photoelectric conversion element) below one microlens. In the pixel units 43, the amplification transistor and the output line are shared between the pixel units that are adjacent to each other in the column direction (the crosswise direction of the figure). To be more specific, the amplification transistor to which the right photoelectric conversion element in the left-side pixel unit is connected is used also for the output of the left photoelectric conversion element in the right-side pixel unit. The structure and operation of each pixel unit are described hereinafter.

Figure 15:
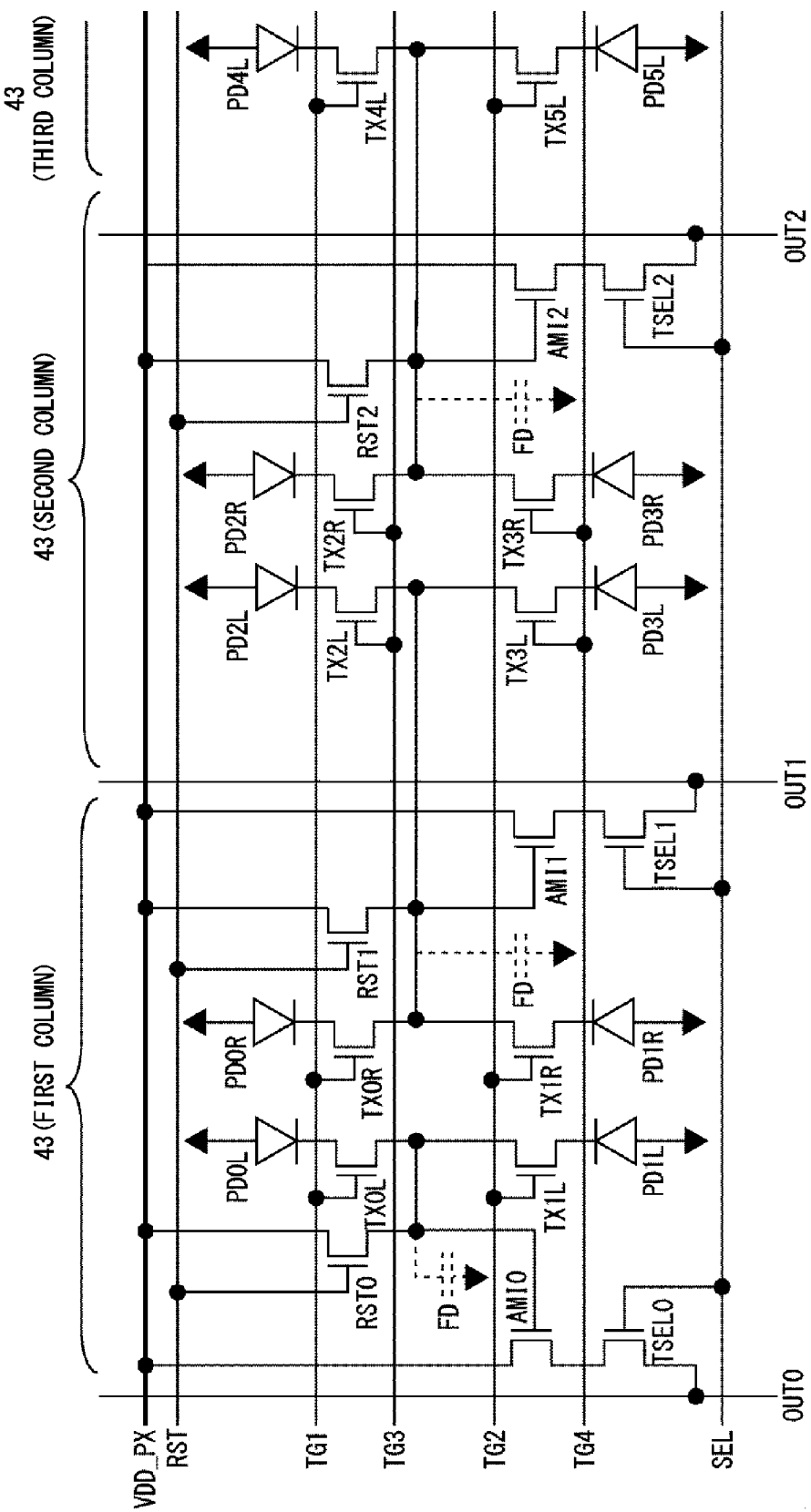
FIG. 15 is a circuit diagram of pixel units of the image sensor according to the second embodiment.

FIG. 15 is a circuit diagram of pixel units of the sensor 15a according to the second embodiment. FIG. 15 shows two and half pixel units 43. In the description of the pixel unit shown in FIG. 15, the photodiodes that are placed in the upper part of the figure in the pixel units 43 that are arranged in odd number columns are a first photoelectric conversion element (for example, a photodiode PD0L) and a second photoelectric conversion element (for example, a photodiode PD0R), and the photodiodes that are placed in the lower part of the figure are a third photoelectric conversion element (for example, a photodiode PD1L) and a fourth photoelectric conversion element (for example, a photodiode PD1R). Further, a first transfer transistor (for example, a transfer transistor TX0L) is placed for the photodiode PD0L, a second transfer transistor (for example, a transfer transistor TX0R) is placed for the photodiode PD0R, a third transfer transistor (for example, a transfer transistor TX1L) is placed for the photodiode PD1L, and a fourth transfer transistor (for example, a transfer transistor TX1R) is placed for the photodiode PD1R.

On the other hand, the photodiodes that are placed in the upper part of the figure in the pixel units 43 that are arranged in even number columns are a fifth photoelectric conversion element (for example, a photodiode PD2L) and a sixth photoelectric conversion element (for example, a photodiode PD2R), and the photodiodes that are placed in the lower part of the figure are a seventh photoelectric conversion element (for example, a photodiode PD3L) and an eighth photoelectric conversion element (for example, a photodiode PD3R). Further, a fifth transfer transistor (for example, a transfer transistor TX2L) is placed for the photodiode PD2L, a sixth transfer transistor (for example, a transfer transistor TX2R) is placed for the photodiode PD2R, a seventh transfer transistor (for example, a transfer transistor TX3L) is placed for the photodiode PD3L, and an eighth transfer transistor (for example, a transfer transistor TX3R) is placed for the photodiode PD3R.

Further, as shown in FIG. 15, in the sensor 15a, a first read timing signal line TG1 is connected to the gates of the transfer transistors TX0L and TX0R that are included in the pixel units 43 arranged in odd number columns. A second read timing signal line TG2 is connected to the gates of the transfer transistors TX1L and TX1R that are included in the pixel units 43 arranged in odd number columns. A third read timing signal line TG3 is connected to the gates of the transfer transistors TX2L and TX2R that are included in the pixel units 43 arranged in even number columns. A fourth read timing signal line TG4 is connected to the gates of the transfer transistors TX3L and TX3R that are included in the pixel units 43 arranged in even number columns. Note that the timing signals that are transmitted through the respective read timing signal lines are enabled (for example, High level) at different timing from one another.

As shown in FIG. 15, in the sensor 15a, the output of the photodiode (for example, the photodiode PD2L) which corresponds to the left photoelectric conversion element in the pixel unit 43 that is placed in the second or subsequent column is output through the second amplification transistor (for example, the amplification transistor AMI1) in the pixel unit that is placed on the left side of that pixel unit and the second output line (for example, the output line OUT1) of the adjacent pixel unit. In other words, the sensor 15a according to the second embodiment uses the second amplification transistor and the second output line in the pixel unit placed on the left side as the first amplification transistor and the first output line in its pixel unit.

Figure 16:
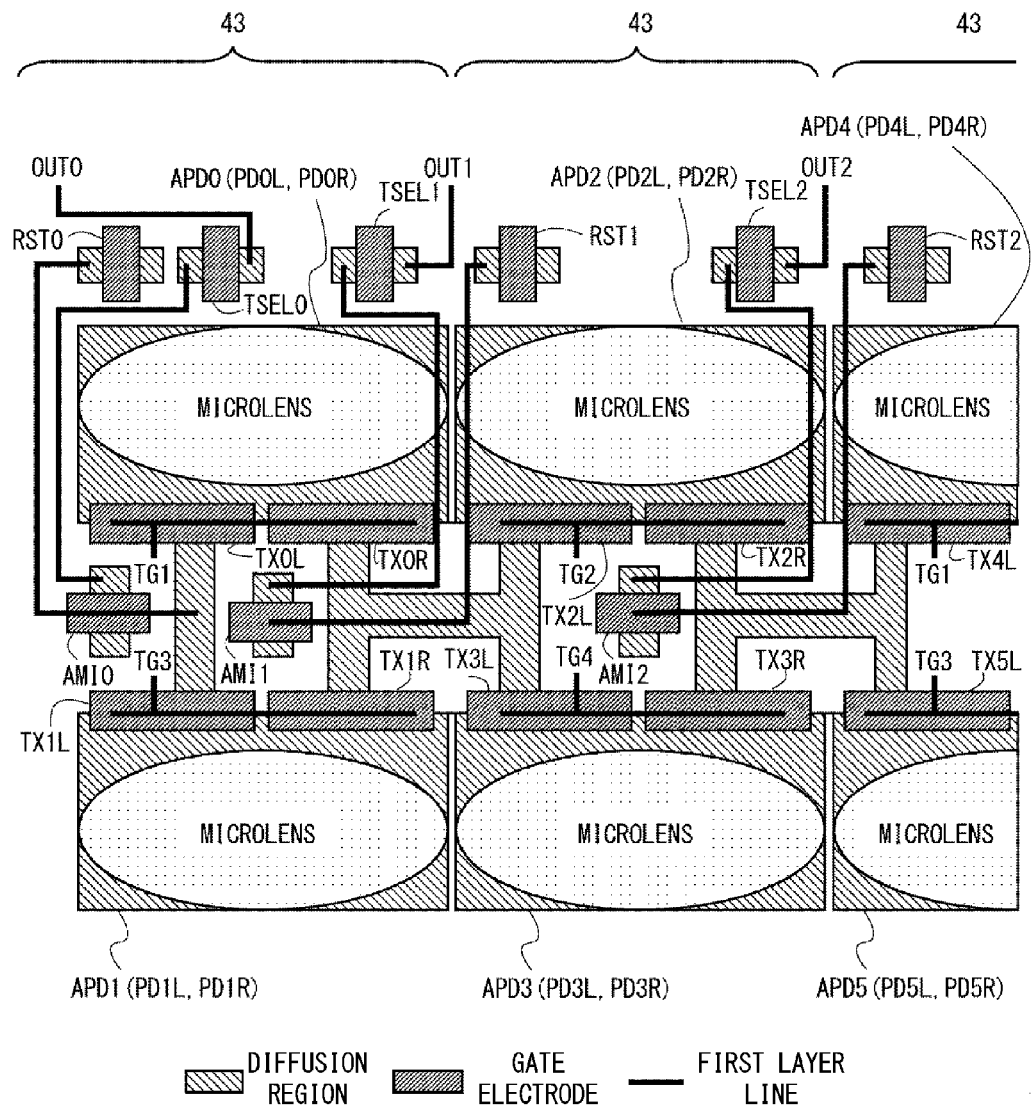
FIG. 16 is a schematic diagram of a layout of the pixel unit of the image sensor according to the second embodiment.

The layout of the pixel unit 43 according to the second embodiment is described hereinbelow. FIG. 16 is a schematic diagram of the layout of the pixel unit 43 according to the second embodiment. As shown in FIG. 16, in the pixel unit 43, the drains of the transfer transistors which correspond to the floating diffusion region are formed across the boundary between adjacent pixels. Specifically, the drain of the transfer transistor corresponding to the right photoelectric conversion element in the left-side pixel unit and the drain of the transfer transistor corresponding to the left photoelectric conversion element in the right-side pixel unit are formed in one region. Further, in the pixel unit 43, the selection transistors and the reset transistors are formed in a part different from the boundary between pixel regions where the floating diffusion region is formed.

To be more specific, the pixel units 43 arranged in odd number columns include the first photoelectric conversion element region APD0, the second photoelectric conversion element region APD1, the first transfer transistor (for example, the transfer transistor TX0L), the second transfer transistor (for example, the transfer transistor TX0R), the third transfer transistor (for example, the transfer transistor TX1L), the fourth transfer transistor (for example, the transfer transistor TX1R), the first floating diffusion region, and the second floating diffusion region. In the first photoelectric conversion element region APD0, the first left photoelectric conversion element and the first right photoelectric conversion element are formed below one microlens. In the second photoelectric conversion element region APD1, the second left photoelectric conversion element and the second right photoelectric conversion element are formed below one microlens. The transfer transistor TX0L is formed on the side of the first photoelectric conversion element region APD0 which faces the second photoelectric conversion element region APD1, the first read timing signal line TG1 is connected to its gate, and it is placed corresponding to the first left photoelectric conversion element. The transfer transistor TX0R is formed on the side of the first photoelectric conversion element region APD0 which faces the second photoelectric conversion element region APD1, the first read timing signal line TG1 is connected to its gate, and it is placed corresponding to the first right photoelectric conversion element. The transfer transistor TX1L is formed on the side of the second photoelectric conversion element region APD1 which faces the first photoelectric conversion element region APD0, the second read timing signal line TG2 is connected to its gate, and it is placed corresponding to the second left photoelectric conversion element. The transfer transistor TX1R is formed on the side of the second photoelectric conversion element region APD1 which faces the first photoelectric conversion element region APD0, the second read timing signal line TG2 is connected to its gate, and it is placed corresponding to the second right photoelectric conversion element. The first floating diffusion region is formed in a region where the transfer transistor TX0L and the transfer transistor TX1L are connected. The second floating diffusion region is formed in a region where the transfer transistor TX0R and the transfer transistor TX1R are connected.

Further, the pixel units 43 arranged in even number columns include the third photoelectric conversion element region APD2, the fourth photoelectric conversion element region APD3, the fifth transfer transistor (for example, the transfer transistor TX2L), the sixth transfer transistor (for example, the transfer transistor TX2R), the seventh transfer transistor (for example, the transfer transistor TX3L), and the eighth transfer transistor (for example, the transfer transistor TX3R). In the third photoelectric conversion element region APD2, the third left photoelectric conversion element and the third right photoelectric conversion element are formed below one microlens. In the fourth photoelectric conversion element region APD3, the fourth left photoelectric conversion element and the fourth right photoelectric conversion element are formed below one microlens. The transfer transistor TX2L is formed on the side of the third photoelectric conversion element region APD2 which faces the fourth photoelectric conversion element region APD3, the third read timing signal line TG3 is connected to its gate, and it is placed corresponding to the third left photoelectric conversion element. The transfer transistor TX2R is formed on the side of the third photoelectric conversion element region APD2 which faces the fourth photoelectric conversion element region APD3, the third read timing signal line TG3 is connected to its gate, and it is placed corresponding to the third right photoelectric conversion element. The transfer transistor TX3L is formed on the side of the fourth photoelectric conversion element region APD3 which faces the third photoelectric conversion element region APD2, the fourth read timing signal line TG4 is connected to its gate, and it is placed corresponding to the fourth left photoelectric conversion element. The transfer transistor TX3R is formed on the side of the fourth photoelectric conversion element region APD3 which faces the third photoelectric conversion element region APD2, the fourth read timing signal line TG4 is connected to its gate, and it is placed corresponding to the fourth right photoelectric conversion element. In the pixel unit 43 according to the second embodiment, the second floating diffusion region is formed as one region which corresponds to the drains of the transfer transistors TX0R, TX1R, TX2L and TX3L.

Figure 17:
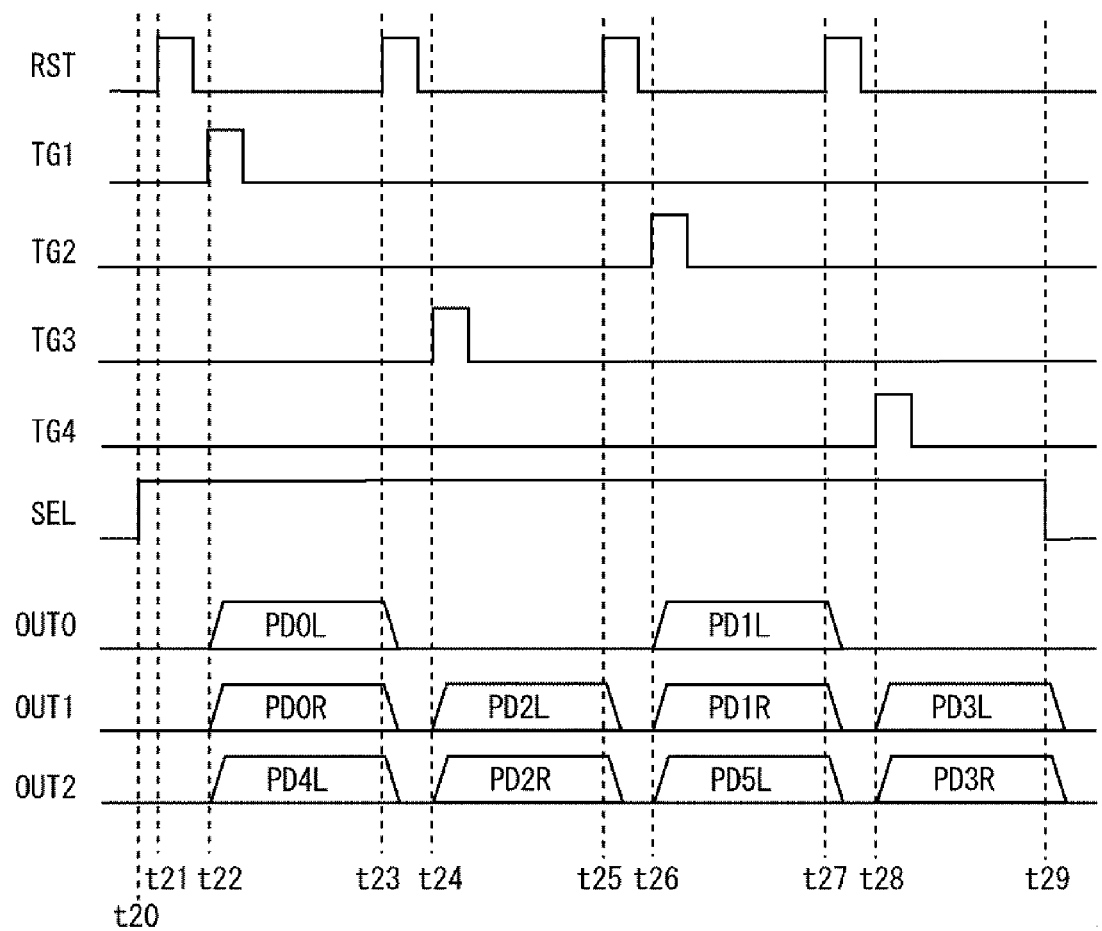
FIG. 17 is a timing chart showing an operation for autofocus control of the image sensor according to the second embodiment.

The operation of the sensor 15a according to the second embodiment is described hereinafter. FIG. 17 is a timing chart showing an operation for autofocus control of the sensor 15a according to the second embodiment.

As shown in FIG. 17, in the sensor 15a according to the second embodiment also, the outputs from the photodiodes to be read are done during the period where the selection signal SEL is High level (timing t20 to t29). Further, in the sensor 15a according to the second embodiment also, the reset signal RST is enabled (for example, High level) each time the photodiodes to be read are switched (timing t21, t23, t25 and t27). Then, after the reset signal RST is disabled (for example, Low level), the read timing signal corresponding to the photodiodes to be read is enabled (timing t22, t24, t26 and t28) to thereby output the output signals from the respective photodiodes. Note that the order of photodiodes to be read can be changed by changing the read timing signals TG1 to TG4.

Figure 18:
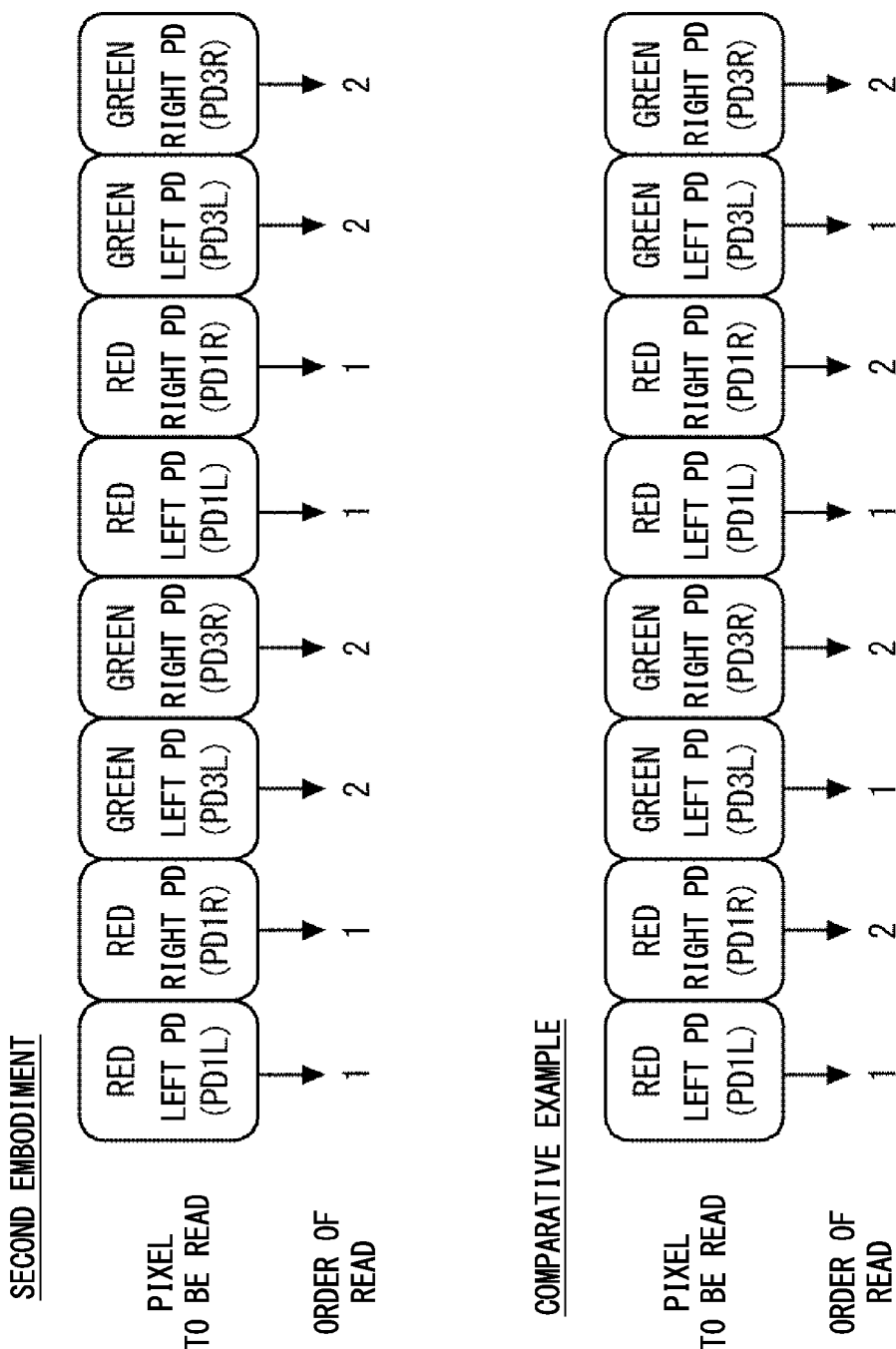
FIG. 18 is a view illustrating a difference in timing of reading pixel information between the image sensor according to the second embodiment and the image sensor according to the comparative example.

As shown in FIG. 17, in the sensor 15a according to the second embodiment also, the outputs from a pair of diodes that are formed below one microlens are made simultaneously at one timing. The read timing of pixels in the pixel unit according to the first embodiment and the pixel unit according to the comparative example (for example, the pixel unit shown in FIG. 9) is described hereinbelow. FIG. 18 is a view illustrating a difference in timing of reading pixel information between the image sensor according to the second embodiment and the image sensor according to the comparative example. FIG. 18 shows an example of obtaining output signals from a row in which photodiodes corresponding to a red color filter and photodiodes corresponding to a green color filter are arranged.

As shown in FIG. 18, in the pixel unit 43 according to the second embodiment, output signals can be obtained from a pair of photodiodes that are formed below one microlens in one time of read operation. Further, in the pixel unit 43 according to the second embodiment, output signals are obtained from all photodiodes that belong to the same row in two times of read operation. On the other hand, in the pixel unit according to the comparative example, output signals are obtained from the photodiodes that correspond to the left photoelectric conversion element out of the photodiodes that belong to the row to be read in the first read operation, and output signals are obtained from the photodiodes that correspond to the right photoelectric conversion element out of the photodiodes that belong to the row to be read in the second read operation. The pixel unit 43 according to the second embodiment and the pixel unit according to the comparative example are the same in that two times of read operations are required to obtain output signals from all photoelectric conversion elements that belong to the row to be read. However, the pixel unit 43 according to the second embodiment and the pixel unit according to the comparative example are different in whether output signals are obtained at the same time from a pair of photodiodes that are formed below one microlens or output signals are obtained at different timing.

As described above, in the sensor 15a using the pixel unit 43 according to the second embodiment, it is possible to obtain output signals at the same time from a pair of photodiodes that are formed below one microlens, just like the sensor 15 according to the first embodiment. The sensor 15a using the pixel unit 43 according to the second embodiment has the structure in which the amplification transistors, the selection transistors, the reset transistors and the output lines are shared by the adjacent pixel units. Therefore, the number of transistors can be reduced in the sensor 15a according to the second embodiment compared with the sensor 15 according to the first embodiment. To be more specific, the number of other transistors with respect to one pair of photodiodes is 2.5 in the pixel unit 23 according to the first embodiment and 1.5 in the pixel unit 43 according to the second embodiment.

Third Embodiment

Figure 19:
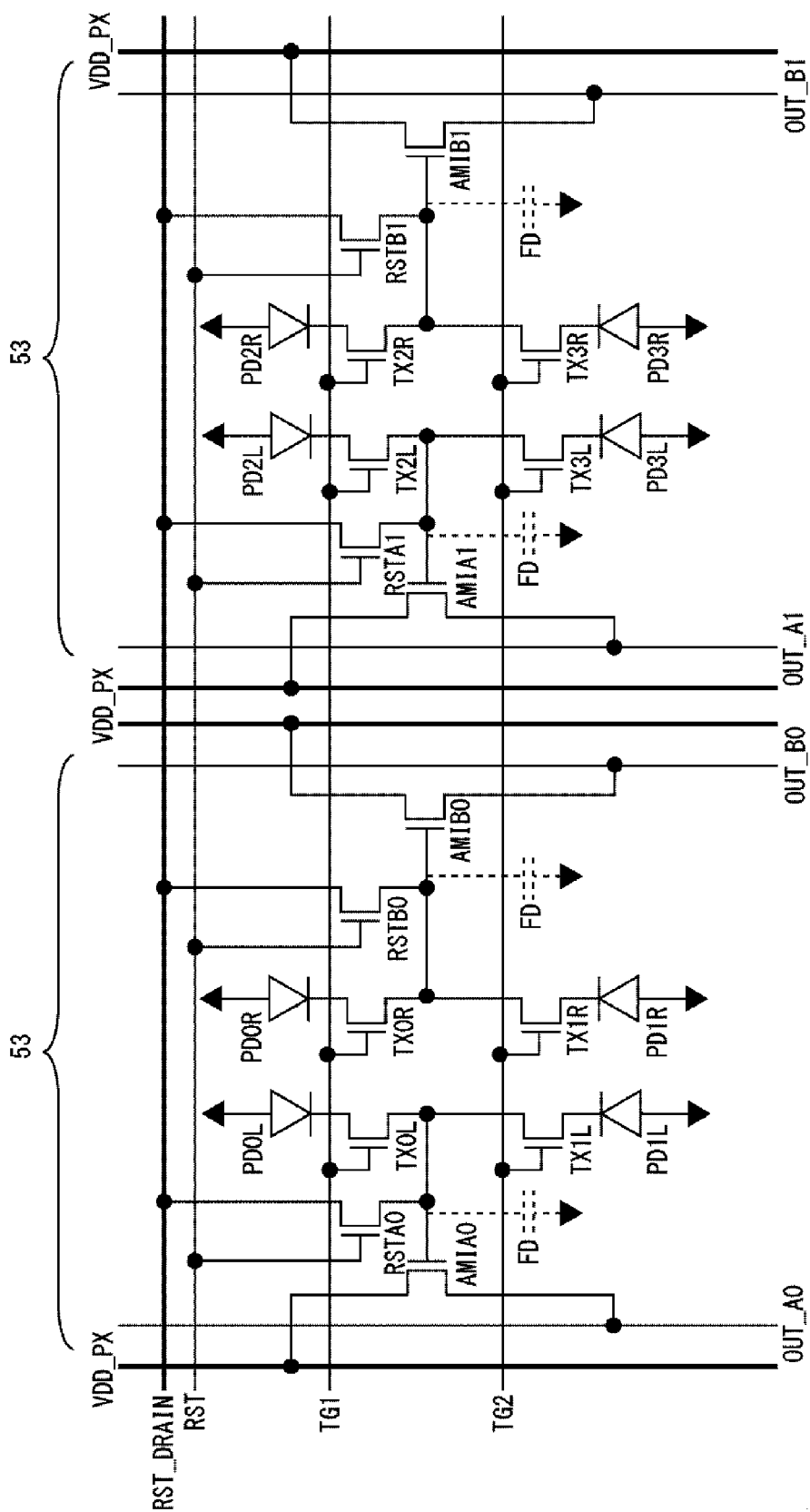
FIG. 19 is a circuit diagram of pixel units of an image sensor according to a third embodiment.

In a third embodiment, another alternative example of the pixel unit 23 according to the first embodiment is described. FIG. 19 is a circuit diagram of a pixel unit 53 according to the third embodiment. As shown in FIG. 19, in the pixel unit 53 according to the third embodiment, the selection transistors TSELA0, TSELB0, TSELA1 and TSELB1 are removed from the pixel unit 23 according to the first embodiment, and the source of the amplification transistor is directly connected to the output line. Further, as shown in FIG. 19, in the pixel unit 53 according to the third embodiment, a drain reset line RST_DRAIN is connected to the drains of the reset transistors RSTA0, RSTB0, RSTA1 and RSTB1. A drain reset signal that is enabled (for example, High level) in the period where the pixel unit 53 is activated is transmitted through the drain reset line RST_DRAIN.

Figure 20:
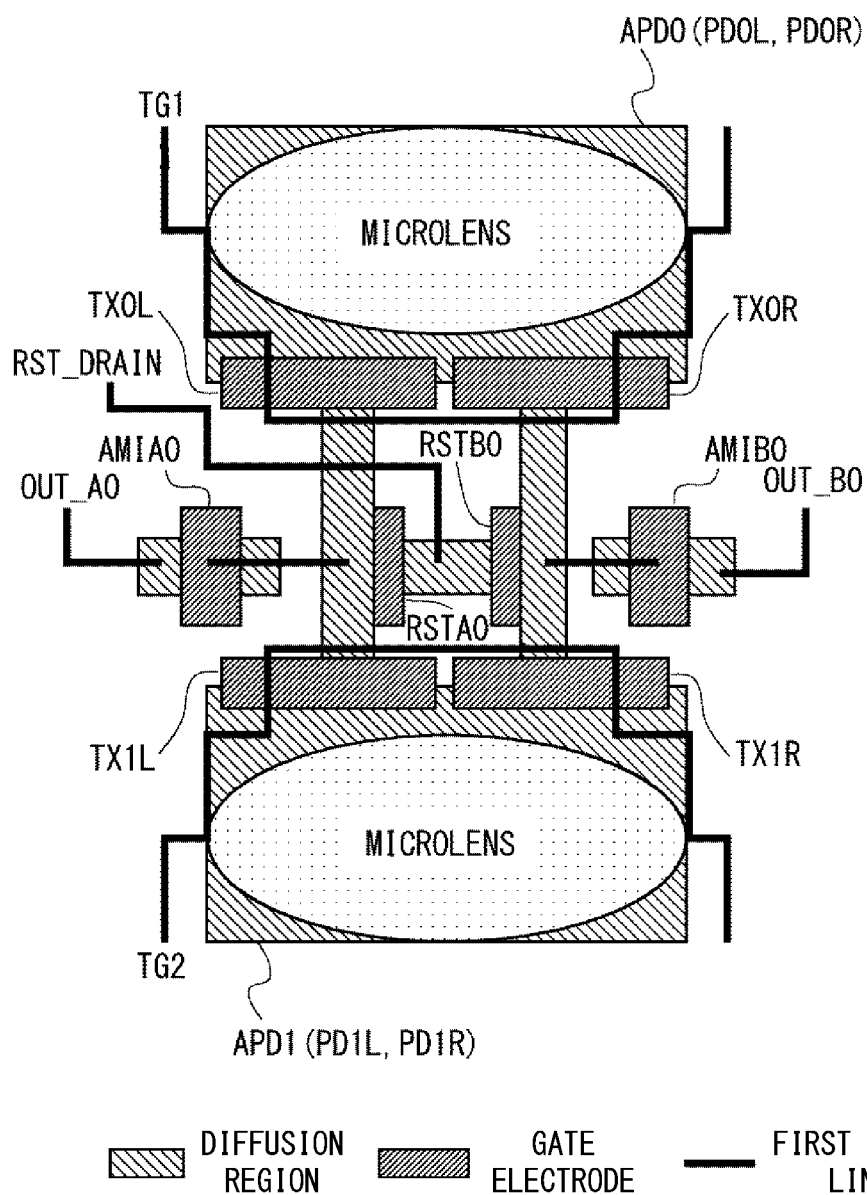
FIG. 20 is a schematic diagram of a layout of the pixel unit of the image sensor according to the third embodiment.

The layout of the pixel unit 53 according to the third embodiment is described hereinafter. FIG. 20 is a schematic diagram of the layout of the pixel unit 53 according to the third embodiment. In the layout shown in FIG. 20, the selection transistors TSELA0 and TSELB0 are removed from the pixel unit 23 according to the first embodiment shown in FIG. 4. Further, in the pixel unit 53 according to the third embodiment, the output line OUT_A0 is directly connected to the diffusion region that corresponds to the source of the amplification transistor AMIA0, and the output line OUT_B0 is directly connected to the diffusion region that corresponds to the source of the amplification transistor AMIB0. In the pixel unit 53 according to the third embodiment, the drain reset line RST_DRAIN is connected to the diffusion region on the source side of the reset transistor RST.

Figure 21:
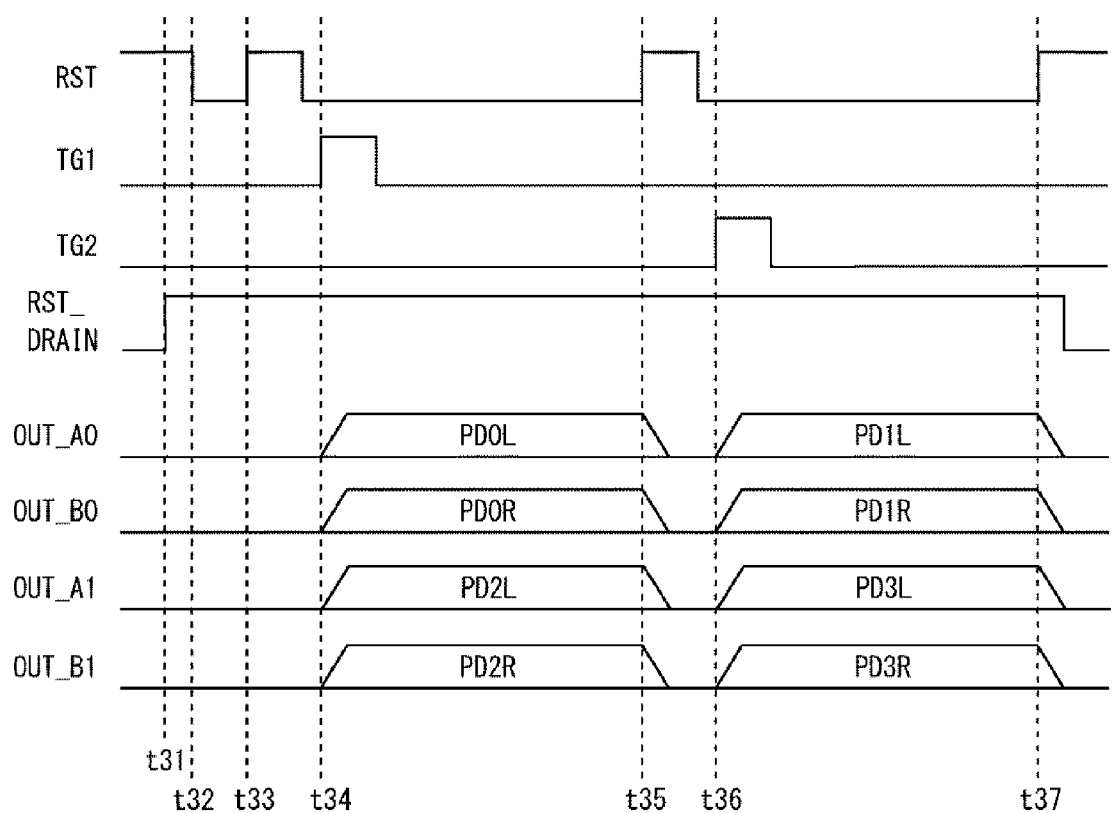
FIG. 21 is a timing chart showing an operation for autofocus control of the image sensor according to the third embodiment.

The operation of the pixel unit 53 according to the third embodiment is described hereinafter. FIG. 21 is a timing chart showing an operation for autofocus control of the sensor according to the third embodiment.

As shown in FIG. 21, in the sensor according to the third embodiment, the drain reset line RST_DRAIN is disabled (for example, Low level or ground voltage level) and the reset signal RST is enabled (for example, High level or power supply voltage level) in a period other than a row selection period where the row to which its pixel unit belongs is activated. A Low-level voltage is thereby applied to the gates of the amplification transistors of the pixel unit 53, and the amplification transistors are shut off.

On the other hand, in the sensor according to the third embodiment, the drain reset line RST_DRAIN is enabled (for example, High level or power supply voltage level) and the reset signal RST is enabled (for example, High level or power supply voltage level) according to reset timing (for example, timing t33, t35) in the row selection period where the row to which its pixel unit belongs is activated. Thus, in the sensor according to the third embodiment, the floating diffusion FD is reset according to the reset signal RST. Further, in the sensor according to the third embodiment, output signals from photodiodes are output to the output line when the first read timing signal TG1 and the second read timing signal TG2 are enabled (timing t34, t36). As shown in FIG. 21, in the sensor according to the third embodiment, output signals from two photodiodes that constitute a photodiode pair are output at the same timing, just like in the sensor 15 according to the first embodiment.

As described above, the sensor that includes the pixel unit 53 according to the third embodiment can output the output signals from two photodiodes that constitute a photodiode pair at the same timing, just like the sensor 15 according to the first embodiment, without the selection transistors. Because the sensor that includes the pixel unit 53 according to the third embodiment eliminates the selection transistors, it is possible to reduce the number of transistors compared with the sensor 15 according to the first embodiment.

Fourth Embodiment

Figure 22:
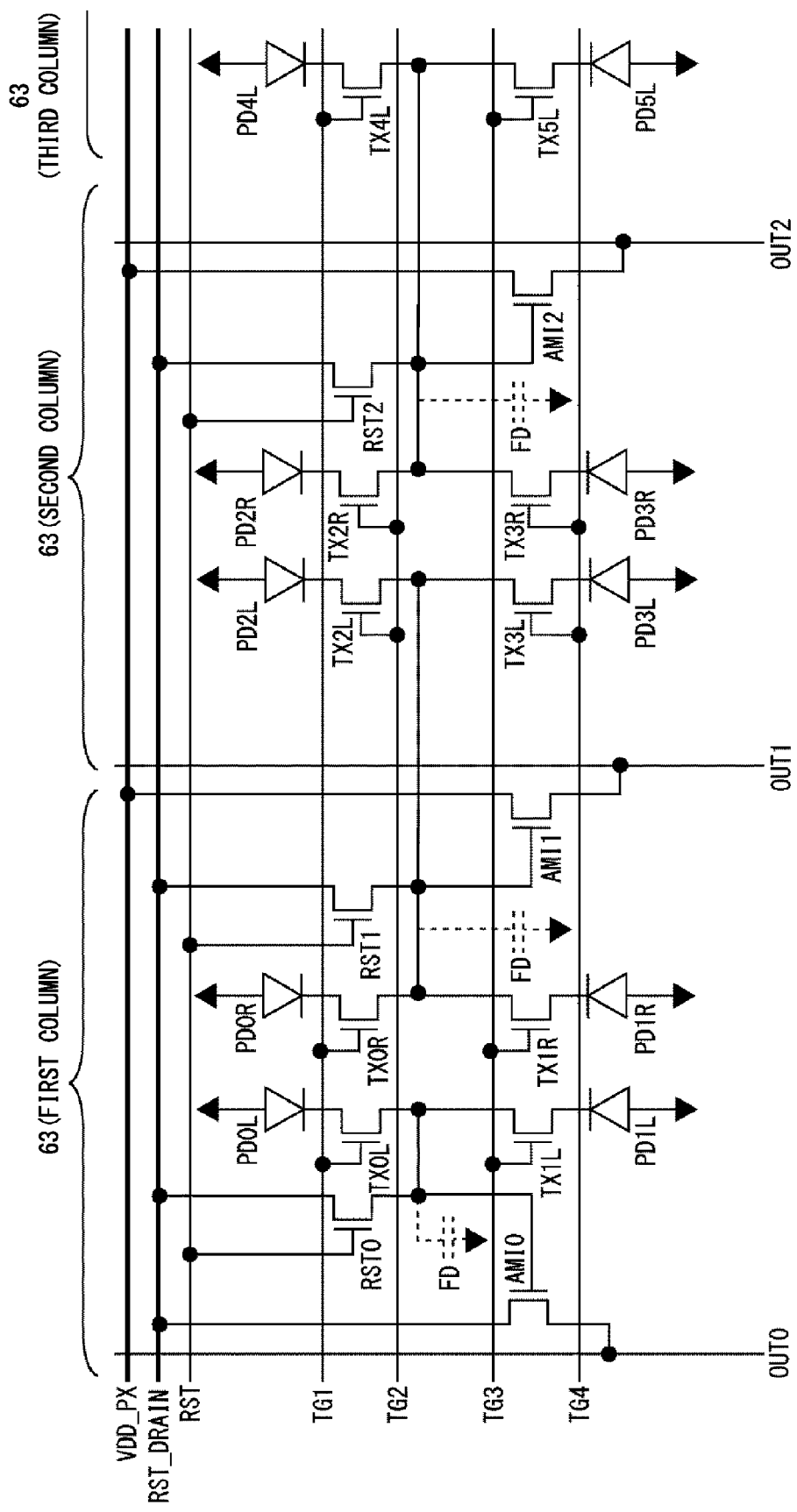
FIG. 22 is a circuit diagram of pixel units of an image sensor according to a fourth embodiment.

In a fourth embodiment, an alternative example of the pixel unit 43 according to the second embodiment is described. FIG. 22 is a circuit diagram of a pixel unit 63 according to the fourth embodiment. As shown in FIG. 22, in the pixel unit 63 according to the fourth embodiment, the selection transistors TSEL0, TSEL1 and TSEL2 are removed from the pixel unit 43 according to the second embodiment, and the source of the amplification transistor is directly connected to the output line. Further, as shown in FIG. 22, in the pixel unit 63 according to the fourth embodiment, a drain reset line RST_DRAIN is connected to the drains of the reset transistors RST0, RST1 and RST2. A drain reset signal that is enabled (for example, High level) in the period where the pixel unit 53 is activated is transmitted through the drain reset line RST_DRAIN.

Figure 23:
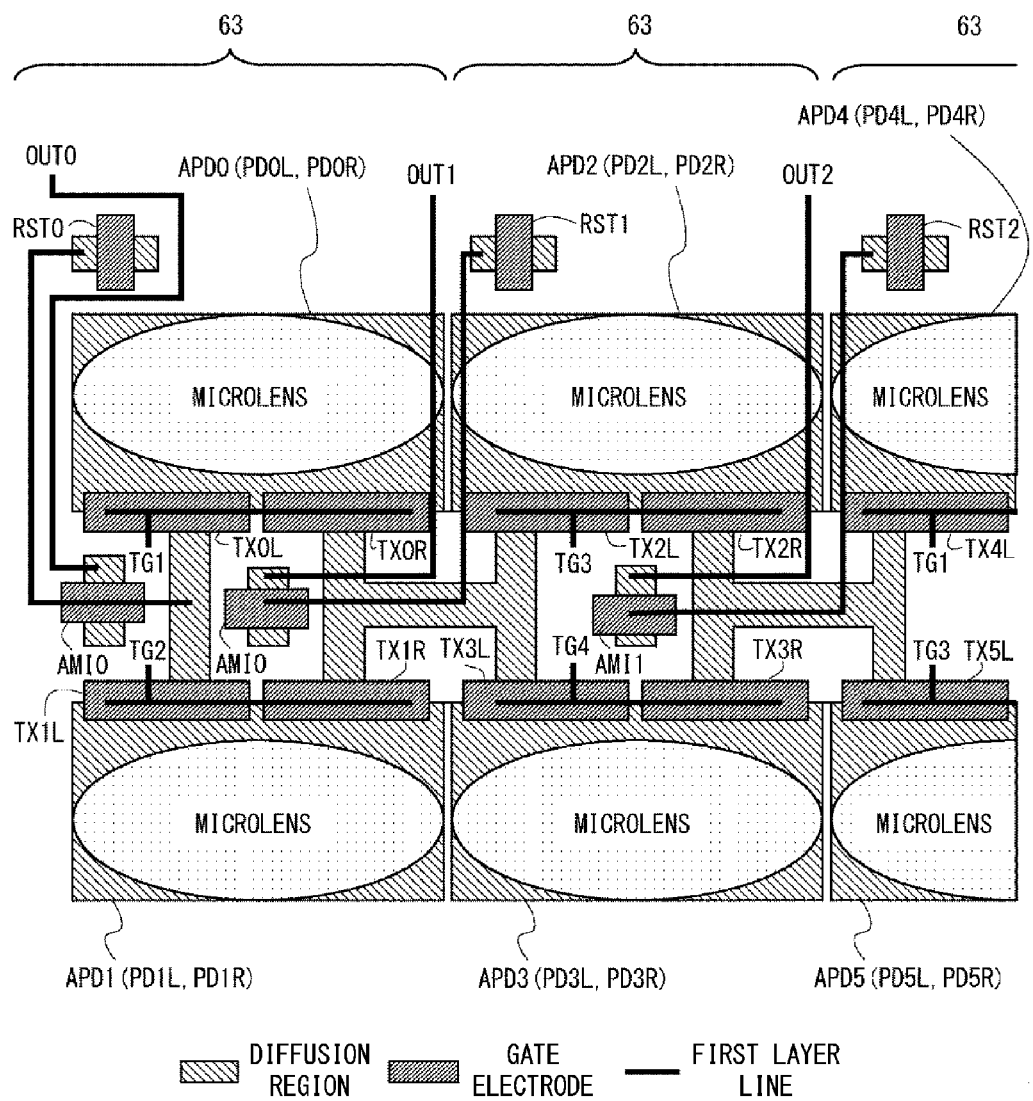
FIG. 23 is a schematic diagram of a layout of the pixel unit of the image sensor according to the fourth embodiment.

The layout of the pixel unit 63 according to the fourth embodiment is described hereinafter. FIG. 23 is a schematic diagram of the layout of the pixel unit 63 according to the fourth embodiment. In the layout shown in FIG. 23, the selection transistors TSEL0, TSEL1 and TSEL2 are removed from the pixel unit 43 according to the second embodiment shown in FIG. 16. Further, in the pixel unit 63 according to the fourth embodiment, the output line is directly connected to the diffusion region that corresponds to the sources of the amplification transistors AMI0, AMI1 and AMI2.

Figure 24:
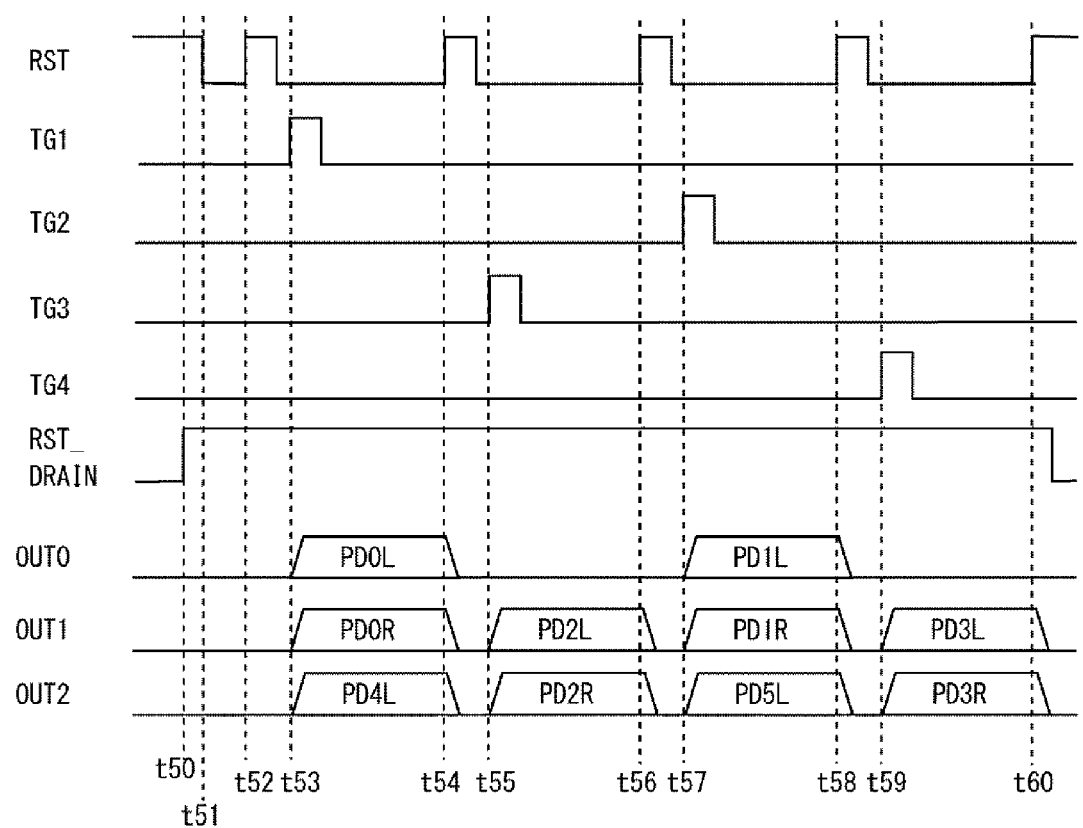
FIG. 24 is a timing chart showing an operation for autofocus control of the image sensor according to the fourth embodiment.

The operation of the pixel unit 63 according to the fourth embodiment is described hereinafter. FIG. 24 is a timing chart showing an operation for autofocus control of the sensor according to the fourth embodiment.

As shown in FIG. 24, in the sensor according to the fourth embodiment, the drain reset line RST_DRAIN is disabled (for example, Low level or ground voltage level) and the reset signal RST is enabled (for example, High level or power supply voltage level) in a period other than a row selection period where the row to which its pixel unit belongs is activated. A Low-level voltage is thereby applied to the gates of the amplification transistors of the pixel unit 63, and the amplification transistors are shut off.

On the other hand, in the sensor according to the fourth embodiment, the drain reset line RST_DRAIN is enabled (for example, High level or power supply voltage level) and the reset signal RST is enabled (for example, High level or power supply voltage level) according to reset timing (for example, timing t42, t44, t46 and t48) in the row selection period where the row to which its pixel unit belongs is activated. Thus, in the sensor according to the fourth embodiment, the floating diffusion FD is reset according to the reset signal RST. Further, in the sensor according to the fourth embodiment, output signals from photodiodes are output to the output line when the first read timing signal TG1 to the fourth read timing signal TG4 are enabled (timing t43, t45, t47 and t49). As shown in FIG. 24, in the sensor according to the fourth embodiment, output signals from two photodiodes that constitute a photodiode pair are output at the same timing, just like in the sensor 15a according to the second embodiment.

As described above, the sensor that includes the pixel unit 63 according to the fourth embodiment can output the output signals from two photodiodes that constitute a photodiode pair at the same timing, just like the sensor 15a according to the second embodiment, without the selection transistors. Because the sensor that includes the pixel unit 63 according to the fourth embodiment eliminates the selection transistors, it is possible to reduce the number of transistors compared with the sensor 15a according to the second embodiment.

While the invention has been described in terms of several embodiments, those skilled in the art will recognize that the invention can be practiced with various modifications within the spirit and scope of the appended claims and the invention is not limited to the examples described above.

The first to fourth embodiments can be combined as desirable by one of ordinary skill in the art.

Further, the scope of the claims is not limited by the embodiments described above.

Furthermore, it is noted that, Applicant's intent is to encompass equivalents of all claim elements, even if amended later during prosecution.

What is claimed is:

1. An image sensor comprising:
   a first photoelectric conversion element region where a first left photoelectric conversion element and a first right photoelectric conversion element are formed below one microlens;
   a second photoelectric conversion element region where a second left photoelectric conversion element and a second right photoelectric conversion element are formed below one microlens;
   a first transfer transistor that is formed on a side of the first photoelectric conversion element region facing the second photoelectric conversion element region, has a gate connected to a first read timing signal line, and is placed corresponding to the first left photoelectric conversion element;
   a second transfer transistor that is formed on a side of the first photoelectric conversion element region facing the second photoelectric conversion element region, has a gate connected to the first read timing signal line, and is placed corresponding to the first right photoelectric conversion element;
   a third transfer transistor that is formed on a side of the second photoelectric conversion element region facing the first photoelectric conversion element region, has a gate connected to a second read timing signal line, and is placed corresponding to the second left photoelectric conversion element;
   a fourth transfer transistor that is formed on a side of the second photoelectric conversion element region facing the first photoelectric conversion element region, has a gate connected to the second read timing signal line, and is placed corresponding to the second right photoelectric conversion element;
   a first floating diffusion region that is formed in a region where the first transfer transistor and the third transfer transistor are connected;
   a second floating diffusion region that is formed in a region where the second transfer transistor and the fourth transfer transistor are connected;

a first amplification transistor where a line connected to the first floating diffusion region is connected to a gate;
a second amplification transistor where a line connected to the second floating diffusion region is connected to a gate;
a first reset transistor that is placed corresponding to the first floating diffusion region; and
a second reset transistor that is placed corresponding to the second floating diffusion region, wherein
the first amplification transistor and the second amplification transistor are formed between the first photoelectric conversion element region and the second photoelectric conversion element region.

2. The image sensor according to claim 1, wherein the first reset transistor and the second reset transistor are formed between the first photoelectric conversion element region and the second photoelectric conversion element region, and sources of the same are formed in one region.

3. The image sensor according to claim 1, comprising:
a third photoelectric conversion element region that is formed in a position adjacent to the first photoelectric conversion element region and where a third left photoelectric conversion element and a third right photoelectric conversion element are formed below one microlens;
a fourth photoelectric conversion element region that is formed in a position adjacent to the second photoelectric conversion element region and where a fourth left photoelectric conversion element and a fourth right photoelectric conversion element are formed below one microlens;
a fifth transfer transistor that is formed on a side of the third photoelectric conversion element region facing the fourth photoelectric conversion element region and placed corresponding to the third left photoelectric conversion element; and
a sixth transfer transistor that is formed on a side of the fourth photoelectric conversion element region facing the third photoelectric conversion element region and placed corresponding to the fourth left photoelectric conversion element, wherein
the second floating diffusion is formed in a region where the second transfer transistor, the fourth transfer transistor, the fifth transfer transistor and the sixth transfer transistors are connected.

4. An image sensor comprising:
a first photoelectric conversion element region where a first left photoelectric conversion element and a first right photoelectric conversion element are formed below one microlens;
a second photoelectric conversion element region where a second left photoelectric conversion element and a second right photoelectric conversion element are formed below one microlens;
a first transfer transistor that is formed on a side of the first photoelectric conversion element region facing the second photoelectric conversion element region, has a gate connected to a first read timing signal line, and is placed corresponding to the first left photoelectric conversion element;
a second transfer transistor that is formed on a side of the first photoelectric conversion element region facing the second photoelectric conversion element region, has a gate connected to the first read timing signal line, and is placed corresponding to the first right photoelectric conversion element;
a third transfer transistor that is formed on a side of the second photoelectric conversion element region facing the first photoelectric conversion element region, has a gate connected to a second read timing signal line, and is placed corresponding to the second left photoelectric conversion element;
a fourth transfer transistor that is formed on a side of the second photoelectric conversion element region facing the first photoelectric conversion element region, has a gate connected to the second read timing signal line, and is placed corresponding to the second right photoelectric conversion element;
a first floating diffusion region that is formed in a region where the first transfer transistor and the third transfer transistor are connected;
a second floating diffusion region that is formed in a region where the second transfer transistor and the fourth transfer transistor are connected;
a first amplification transistor where a line connected to the first floating diffusion region is connected to a gate;
a second amplification transistor where a line connected to the second floating diffusion region is connected to a gate;
a first reset transistor that is placed corresponding to the first floating diffusion region; and
a second reset transistor that is placed corresponding to the second floating diffusion region, wherein
the first reset transistor and the second reset transistor are formed between the first photoelectric conversion element region and the second photoelectric conversion element region, and sources of the same are formed in one region.

5. The image sensor according to claim 4, wherein the first amplification transistor and the second amplification transistor are formed between the first photoelectric conversion element region and the second photoelectric conversion element region.

6. The image sensor according to claim 4, comprising:
a third photoelectric conversion element region that is formed in a position adjacent to the first photoelectric conversion element region and where a third left photoelectric conversion element and a third right photoelectric conversion element are formed below one microlens;
a fourth photoelectric conversion element region that is formed in a position adjacent to the second photoelectric conversion element region and where a fourth left photoelectric conversion element and a fourth right photoelectric conversion element are formed below one microlens;
a fifth transfer transistor that is formed on a side of the third photoelectric conversion element region facing the fourth photoelectric conversion element region and placed corresponding to the third left photoelectric conversion element; and
a sixth transfer transistor that is formed on a side of the fourth photoelectric conversion element region facing the third photoelectric conversion element region and placed corresponding to the fourth left photoelectric conversion element, wherein
the second floating diffusion is formed in a region where the second transfer transistor, the fourth transfer transistor, the fifth transfer transistor and the sixth transfer transistors are connected.

7. An image sensor comprising:
a first photoelectric conversion element region where a first left photoelectric conversion element and a first right photoelectric conversion element are formed below one microlens;
a second photoelectric conversion element region where a second left photoelectric conversion element and a second right photoelectric conversion element are formed below one microlens;
a first transfer transistor that is formed on a side of the first photoelectric conversion element region facing the second photoelectric conversion element region, has a gate connected to a first read timing signal line, and is placed corresponding to the first left photoelectric conversion element;
a second transfer transistor that is formed on a side of the first photoelectric conversion element region facing the second photoelectric conversion element region, has a gate connected to the first read timing signal line, and is placed corresponding to the first right photoelectric conversion element;
a third transfer transistor that is formed on a side of the second photoelectric conversion element region facing the first photoelectric conversion element region, has a gate connected to a second read timing signal line, and is placed corresponding to the second left photoelectric conversion element;
a fourth transfer transistor that is formed on a side of the second photoelectric conversion element region facing the first photoelectric conversion element region, has a gate connected to the second read timing signal line, and is placed corresponding to the second right photoelectric conversion element;
a first floating diffusion region that is formed in a region where the first transfer transistor and the third transfer transistor are connected;
a second floating diffusion region that is formed in a region where the second transfer transistor and the fourth transfer transistor are connected;
a first amplification transistor where a line connected to the first floating diffusion region is connected to a gate;
a second amplification transistor where a line connected to the second floating diffusion region is connected to a gate;
a first reset transistor that is placed corresponding to the first floating diffusion region; and
a second reset transistor that is placed corresponding to the second floating diffusion region;
a third photoelectric conversion element region that is formed in a position adjacent to the first photoelectric conversion element region and where a third left photoelectric conversion element and a third right photoelectric conversion element are formed below one microlens;
a fourth photoelectric conversion element region that is formed in a position adjacent to the second photoelectric conversion element region and where a fourth left photoelectric conversion element and a fourth right photoelectric conversion element are formed below one microlens;
a fifth transfer transistor that is formed on a side of the third photoelectric conversion element region facing the fourth photoelectric conversion element region and placed corresponding to the third left photoelectric conversion element; and
a sixth transfer transistor that is formed on a side of the fourth photoelectric conversion element region facing the third photoelectric conversion element region and placed corresponding to the fourth left photoelectric conversion element, wherein
the second floating diffusion is formed in a region where the second transfer transistor, the fourth transfer transistor, the fifth transfer transistor and the sixth transfer transistors are connected.

8. The image sensor according to claim 7, wherein the first amplification transistor and the second amplification transistor are formed between the first photoelectric conversion element region and the second photoelectric conversion element region.

9. The image sensor according to claim 7, wherein the first reset transistor and the second reset transistor are formed between the first photoelectric conversion element region and the second photoelectric conversion element region, and sources of the same are formed in one region.

* * * * *